(12) United States Patent
Disney et al.

(10) Patent No.: US 9,741,845 B2
(45) Date of Patent: Aug. 22, 2017

(54) LATERAL HIGH VOLTAGE TRANSISTOR

(71) Applicant: GLOBALFOUNDRIES Singapore Pte. Ltd., Singapore (SG)

(72) Inventors: Donald Ray Disney, Singapore (SG); Jongjib Kim, Singapore (SG); Wen-Cheng Lin, Singapore (SG)

(73) Assignee: GLOBALFOUNDRIES SINGAPORE PTE. LTD., Singapore (SG)

(*) Notice: Subject to any disclaimer, the term of this patent is extended or adjusted under 35 U.S.C. 154(b) by 0 days.

(21) Appl. No.: 15/137,018

(22) Filed: Apr. 25, 2016

(65) Prior Publication Data

US 2016/0315188 A1 Oct. 27, 2016

(51) Int. Cl.
*H01L 29/78* (2006.01)
*H01L 29/06* (2006.01)
*H01L 29/40* (2006.01)
*H01L 29/66* (2006.01)

(52) U.S. Cl.
CPC ........ *H01L 29/7816* (2013.01); *H01L 29/063* (2013.01); *H01L 29/0634* (2013.01); *H01L 29/0653* (2013.01); *H01L 29/0692* (2013.01); *H01L 29/402* (2013.01); *H01L 29/66659* (2013.01); *H01L 29/66681* (2013.01); *H01L 29/7835* (2013.01); *H01L 29/665* (2013.01)

(58) Field of Classification Search
CPC .................................................. H01L 29/7816
See application file for complete search history.

(56) References Cited

U.S. PATENT DOCUMENTS

| | | |
|---|---|---|
| 2008/0197410 A1 | 8/2008 | Chiang et al. |
| 2009/0001462 A1 | 1/2009 | Huang et al. |
| 2010/0096697 A1 | 4/2010 | Su et al. |
| 2010/0207207 A1 | 8/2010 | Tsai |
| 2012/0061758 A1 | 3/2012 | Khan et al. |
| 2013/0134511 A1 | 5/2013 | Yang et al. |
| 2013/0207191 A1 | 8/2013 | Chen et al. |
| 2014/0021540 A1 | 1/2014 | Khayat et al. |
| 2014/0179079 A1 | 6/2014 | Huang et al. |

*Primary Examiner* — Fernando L Toledo
*Assistant Examiner* — Valerie N Newton
(74) *Attorney, Agent, or Firm* — Horizon IP Pte Ltd.

(57) ABSTRACT

A device and a method for forming a device are disclosed. The device includes a substrate with a high voltage (HV) device region. The HV device region is defined with first and second device isolation regions and an internal dielectric region which are shallow trench isolation (STI) regions. A HV transistor is disposed in the HV device region. The HV transistor includes a gate dielectric layer on the substrate, a gate disposed on the gate dielectric layer, and a source region disposed in the substrate adjacent to the gate and first device isolation region while a drain region disposed in the substrate adjacent to the second device isolation region. A drift well and a body well are disposed in the substrate. At least one buried RESURF region is disposed under the internal dielectric region.

29 Claims, 20 Drawing Sheets

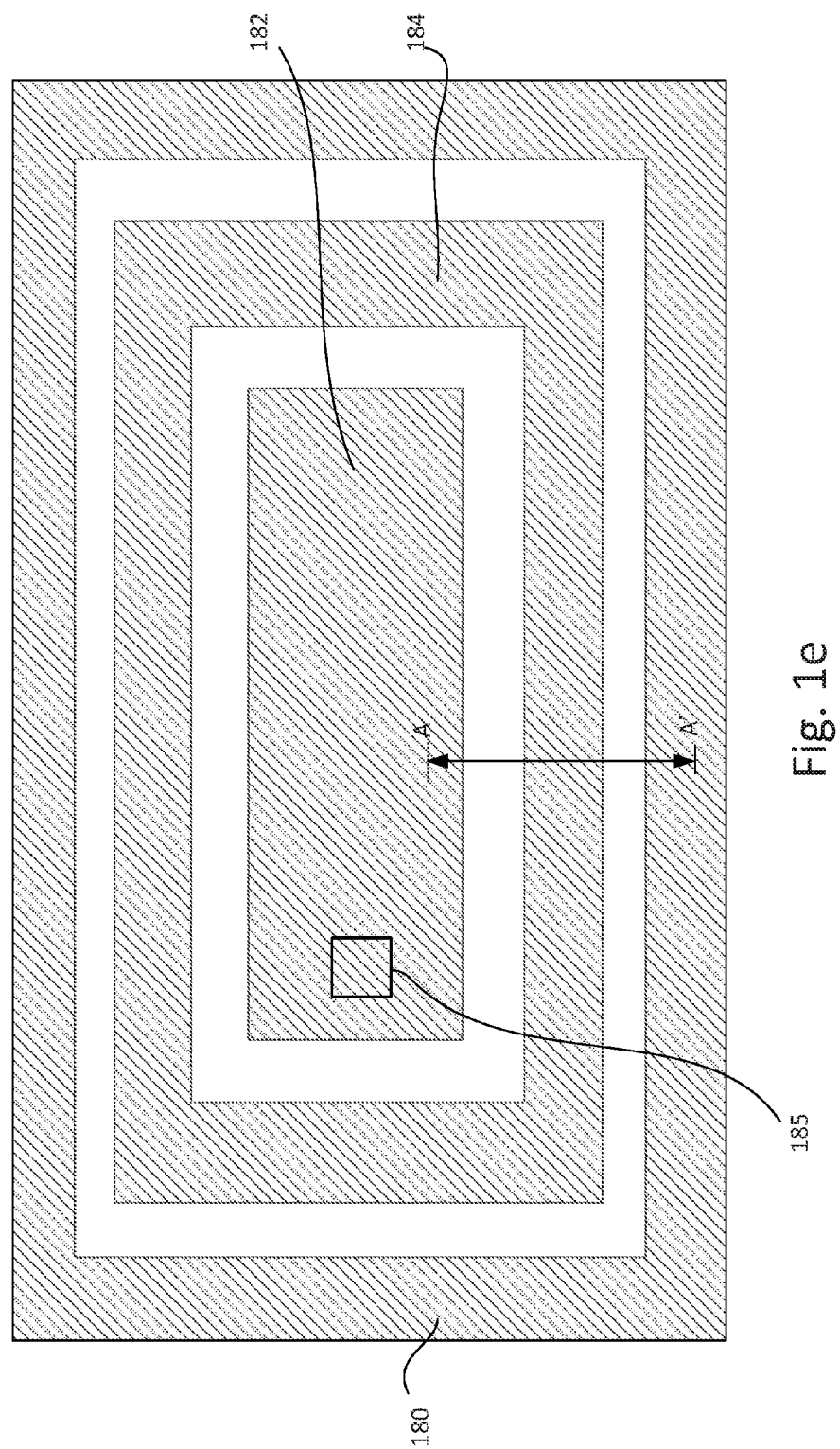

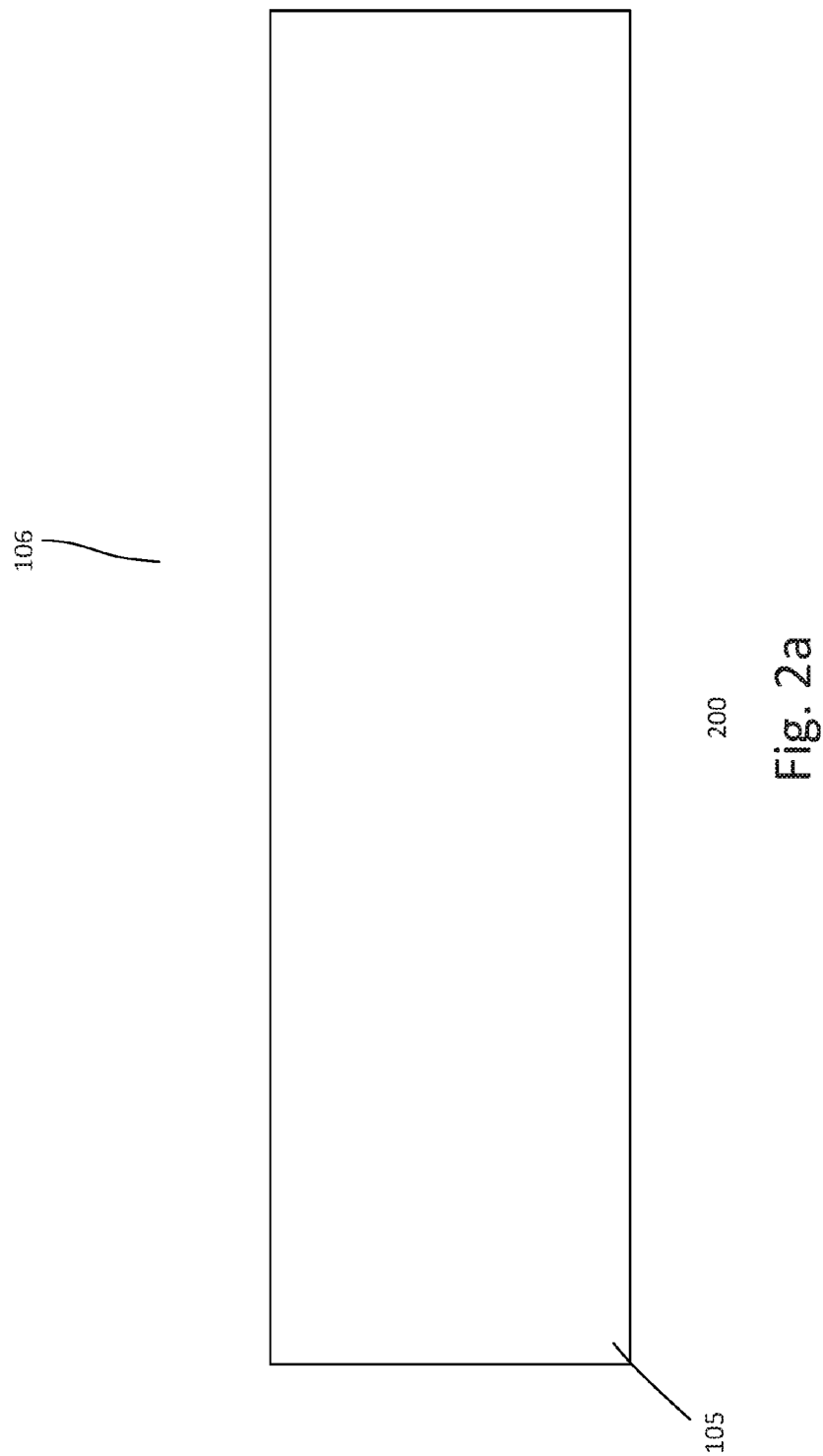

LATERAL HIGH VOLTAGE TRANSISTOR

CROSS-REFERENCE TO RELATED APPLICATION

This application claims priority to Singapore Patent Application No. 10201503305P, filed on Apr. 27, 2015, which is herein incorporated by reference in its entirety for all purposes.

BACKGROUND

As technology evolves into era of sub-micron, there is a desire to integrate lateral high voltage (HV) devices with dense digital and analog circuitry. Nevertheless, it is difficult to integrate these different types of devices in a single chip since different devices have different process and device requirements. The conventional process used for integrating these devices has limitations. For example, the breakdown voltage of the lateral high voltage devices may be degraded when integrating with dense and analog circuitry using conventional process.

From the foregoing discussion, it is desirable to provide a reliable, high performing, simplified and cost effective solution for integrating high voltage devices with dense digital circuitry in the same IC.

SUMMARY

Embodiments generally related to semiconductor devices and methods for forming a device. In one embodiment, a device is disclosed. The device includes a substrate having a high voltage (HV) device region. The HV device region is defined with first and second device isolation regions and an internal dielectric region. The device isolation regions and internal dielectric region are shallow trench isolation (STI) regions. A HV transistor is disposed in the HV device region. The HV transistor includes a gate dielectric layer disposed on the substrate, a gate disposed on the gate dielectric layer and a source region disposed in the substrate adjacent to the gate and first device isolation region while a drain region disposed in the substrate adjacent to the second device isolation region. A drift well is disposed in the substrate. The drift well encompasses the drain region and extends under a portion of the gate. A body well is disposed in the substrate. The body well encompasses the source region and extends laterally toward the drift well. At least one buried RESURF region is disposed within the drift well. The at least one buried RESURF region includes a first buried RESURF region which is disposed under the internal dielectric region.

In another embodiment, a method for forming a high voltage (HV) device is presented. The method includes providing a substrate. First device isolation region and an internal dielectric region are formed in the substrate. The device isolation region and internal dielectric region are shallow trench isolation (STI) regions. A gate dielectric is formed over the substrate and a gate is formed on the gate dielectric. A source region is formed in the substrate adjacent to the gate and first device isolation region. A drift well is formed in the substrate. The drift well encompasses the drain region and extends under a portion of the gate. A body well is formed in the substrate. The body well encompasses the source region and extends laterally toward the drift well. The method also includes forming at least one buried RESURF region within the drift well. The at least one buried RESURF region is formed under the internal dielectric region.

In yet another embodiment, a high voltage (HV) transistor is disclosed. The HV transistor includes a semiconductor substrate having a first conductivity type. An internal dielectric region is disposed in the substrate. The internal dielectric region has a top surface which is substantially planar with a top surface of the substrate. A gate dielectric layer is disposed on the substrate and a gate is disposed on the gate dielectric layer. A source region is disposed in the substrate adjacent to the gate and a drain region is disposed in the substrate and is separated from the source region by the internal dielectric region. A drift well is disposed in the substrate. The drift well encompasses the drain region, extends under a first portion of the gate and is separated from the source region by a second portion of the gate. A body well is disposed in the substrate. The body well encompasses the source region and extends laterally under the gate toward the drift well. The HV transistor also includes a first buried RESURF region disposed within the drift well and under the internal dielectric region.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 1e-1f show simplified top views of various embodiments of configuration of the isolation regions and internal dielectric region of a HV transistor.

DETAILED DESCRIPTION

Figure 1A:
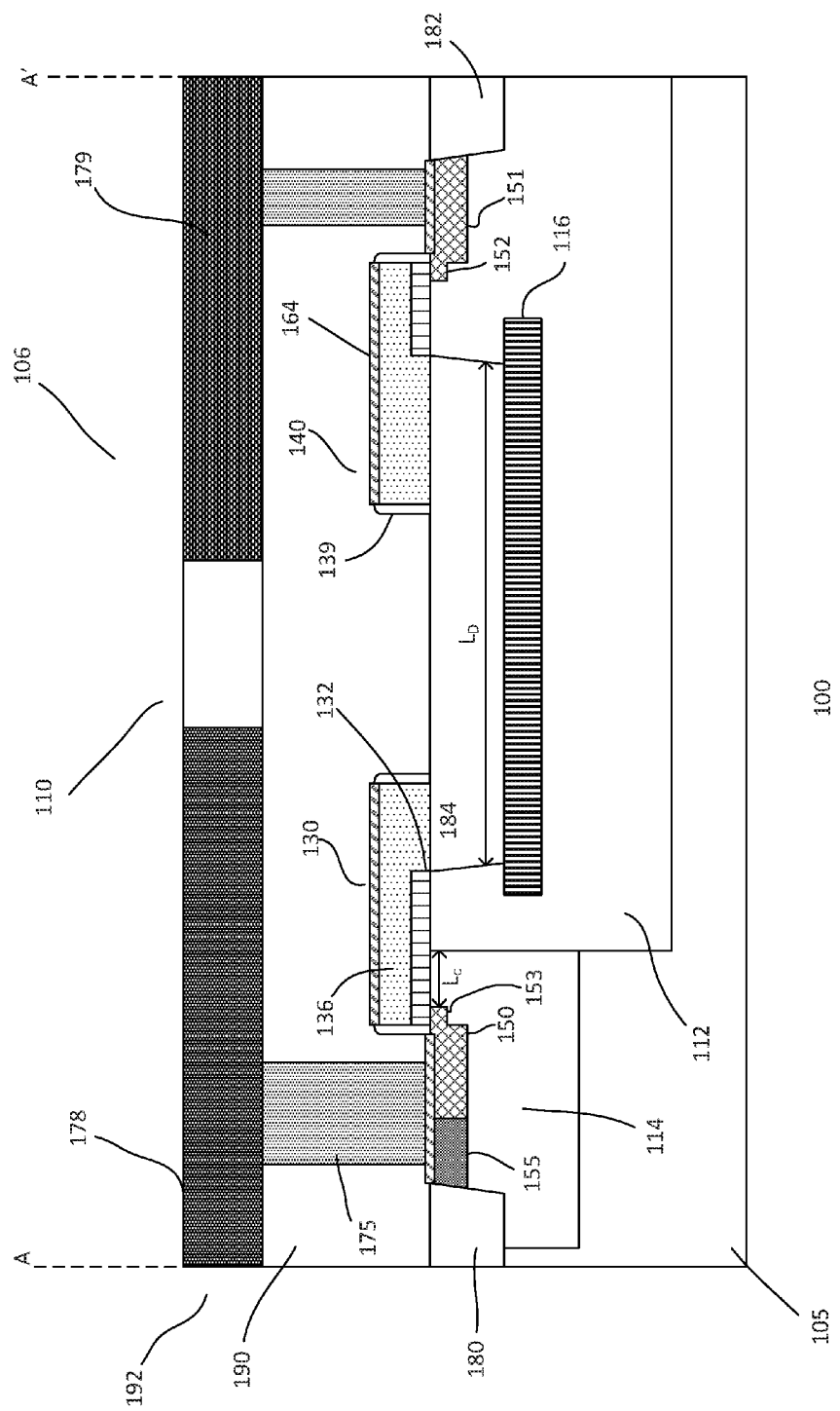
FIGS. 1a-1d show cross-sectional views of various embodiments of a device.

Embodiments generally relate to semiconductor devices or integrated circuits (ICs). More particularly, some embodiments relate to high voltage (HV) devices. For example, HV devices include HV transistors, such as metal oxide semiconductor (MOS) transistors, with breakdown voltages in excess of 200 V. The devices or ICs can be incorporated into or used with, for example, AC/DC and DC/DC power conversion applications, motor drivers, medical equipment, and lighting systems. The devices or ICs can also be incorporated into other suitable applications.

FIGS. 1a-1d show cross-sectional views of various embodiments of a high voltage device 100, such as a high voltage MOS transistor. The cross-sectional views are along a channel length direction of the device. The device, for example, may be integrated with lower-voltage transistors in an IC. Other types of high voltage devices, such as junction field-effect transistors (JFETs) and depletion-mode MOS-FETs, may also be useful. As shown, the device includes a semiconductor substrate 105. The substrate, for example, is a silicon substrate. Other types of substrates, such as silicon germanium, germanium, gallium arsenide, or crystal-oninsulator (COI) such as silicon-on-insulator (SOI), are also useful. The substrate may be a doped substrate. For example, the substrate can be lightly doped with p-type dopants to achieve a bulk resistivity in the range of about 50-150 ohm-cm. Providing a substrate with other types of dopants or dopant concentrations, as well as an undoped substrate, may also be useful.

The substrate includes a HV device region 106. The HV device region, in one embodiment, includes a lateral HV transistor. The HV transistor, for example, includes an ultra HV (UHV) device which has a breakdown voltage (BV) of at least 200 V. For example, BV of the HV transistor may be at about 200-300 V, 400-500 V or 600-800 V. Providing the UHV transistor with other BV may also be useful. Providing other types of device regions may also be useful. The substrate may also include regions (not shown) for other types of circuitry, depending on the type of device or IC. For example, the substrate may also include regions for HV, intermediate voltage (IV) or medium voltage (MV) and low voltage (LV) devices as well as an array region for a plurality of interconnected memory devices. Providing other types of device regions within the substrate may also be useful.

In one embodiment, the HV device region is isolated from other regions by an isolation region 180. For example, an isolation region surrounds the HV device region. The isolation region, for example, is a shallow trench isolation (STI) region. The STI region, for example, extends to a depth of about 3000-5000 Å. Providing isolation regions which extend to other depths may also be useful. The STI region may have a top surface which is planar with the top surface of the substrate. Although the STI region is shown with a planar top surface, it may be slightly non-planar due to processing, such as clean processes as part of forming the STI. However, such non-planarity is negligible and may be still considered as substantially planar.

A HV transistor 110 is disposed in the device region. In one embodiment, the transistor is an UHV transistor. The HV transistor includes a gate 130 and a drain field plate (DFP) 140 disposed between first diffusion region (source) 150 and second diffusion region (drain) 151. The gate and DFP are disposed on the substrate while the source and drain are disposed in the substrate. The DFP, for example, has the same or similar construction as the gate. The gate and DFP, as shown, includes a gate electrode layer 136 disposed over a gate dielectric layer 132. The gate electrode layer, for example, may be a doped polysilicon layer. The gate electrode layer may also include a silicide layer 164. The gate electrode may be about 2000-8000 Å thick. Other types of gate electrode as well as thicknesses may also be useful. As for the gate dielectric layer, it may include one or more suitable dielectric materials, such as silicon oxide, and silicon nitride. The thickness of the gate dielectric layer should be sufficient to provide adequate gate voltage rating for the HV transistor. For example, the thickness of the gate dielectric layer may be about 100-1000 Å. Other types of gate dielectric or thicknesses may also be useful.

The source 150 is disposed in the substrate adjacent to the gate 130 and device isolation region 180 while the drain 151 is disposed in the substrate adjacent to the DFP and device isolation region 182. Inner edges of the source and drain may be laterally offset from the outer edges of the gate and DFP by sidewall spacers 139. In other embodiments, inner edges of the source and drain may be aligned with outer edges of the gate and DFP. The source and drain are doped regions. The source and drain, in one embodiment, are heavily doped with first polarity type dopants for a first type transistor. For example, the source and drain are heavily doped n-type ($n^+$) regions for a n-type transistor. Providing heavily doped p-type ($p^+$) regions may also be useful for a p-type transistor. The heavily doped regions, for example, have a dopant concentration of about $1\times10^{18}$-$1\times10^{20}$/cm$^3$. Other dopant concentrations for the doped source and drain may also be useful. The depth of the source and drain is shallower than the device isolation regions 180 and 182. The depth, for example, may be about 0.1-0.3 µm. Providing source and drain having other depths may also be useful.

The source and drain may include light doped drain (LDD) extensions 152 and 153. The LDD extensions or LDDs, in one embodiment, are lightly doped with first polarity type dopants for a first type transistor. For example, the LDDs are lightly doped n-type ($n^-$) extensions for a n-type transistor. Providing lightly doped p-type (p) extension regions for a p-type transistor may also be useful. The LDDs, for example, have a dopant concentration of about $1\times10^{16}$-$1\times10^{18}$/cm$^3$. Other dopant concentrations for the LDDs may also be useful. As shown, a depth of the LDDs is shallower than the source and drain. In other embodiments, the depth of the LDDs may be deeper than the source and drain. The depth of the LDDs, for example, may be about 0.05 to 0.3 µm. Providing LDDs having other depths may also be useful.

The LDDs extend under the gate and DFP. The LDDs extend about 20-200 nm under the gates. Extending the LDDs by other distances under the gate may also be useful.

To facilitate forming self-aligned LDDs, source and drain, dielectric sidewall spacers 139 may be disposed on sidewalls of the gate and DFP. The dielectric spacers, for example, may be silicon oxide. Other types of dielectric spacers, such as silicon nitride or a combination of dielectric layers may also be useful. A thickness of the spacers, for example, may be about 50-100 nm. Other thicknesses may also be useful.

In some embodiments, no spacers are provided on sidewalls of the gates and no LDDs are provided in the source and drain regions. Other configurations of gates and source and drain regions may also be useful.

A drift well 112 is disposed in the substrate in the HV device region. The drift well encompasses the drain region and extends under a portion of the gate. The drift well serves to support a high BV when the HV transistor is OFF (blocking current flow) and serves as a conduction path between the source and drain when the HV transistor is ON (allowing current flow). A depth of the drift well may be about 6-10 µm. Other depths for the drift well may also be useful. In one embodiment, the drift well is doped with first polarity type dopants for a first polarity type device. For example, the drift well may be doped with n-type dopants for a n-type device. Alternatively, the first polarity type dopants may be p-type for a p-type device. The dopant concentration of the drift well is less than the source and drain regions, and higher than the substrate. For example, the dopant concentration of the drift well may be about $1\times10^{15}$-$1\times10^{17}$/cm$^3$. Other dopant concentration for the drift well may also be useful.

An internal dielectric region 184 is disposed in the substrate within the drift well 112. The internal dielectric region, in one embodiment, is an internal STI region. The internal STI region, for example, is similar in construction as the isolation regions 180 and 182. For example, the internal STI region may be lade of the same material and have the same depth. Moreover, the internal STI region may be formed using the same processing steps as the isolation regions which are formed in the HV device region as well as other device regions in the same substrate, to minimize the processing cost. The width of the internal STI region may be different than the isolation regions. For example, the internal STI region may be wider along the length direction of the device region than the isolation regions. In one embodiment, a width of the internal STI region along the length direction of the device region extends partially under the gate and DFP. The extension of the gate over a portion of the internal STI region acts as a source-side field plate, mitigating the electric field crowding that occurs due to the discontinuities associated with the edge of the drift well and the edge of the internal STI region. The extension of the DFP over a portion of the internal STI region acts as a drain-side field plate, mitigating the electric field crowding that occurs due to the discontinuities associated with the edge of the drain and the edge of the internal STI region. The length of the overlap of the internal STI region with the gate, and the length of the overlap of the internal STI region with the DFP, may be tailored to provide an electric field distribution within the HV transistor (in both ON and OFF states) so that the HV transistor achieves high BV and high reliability.

The drift region of the HV transistor ($L_D$) may be defined as the lateral extent of the internal STI region along the length direction of the HV device. The $L_D$ may be scaled to provide HV transistors with different BVs. For example, $L_D$ in the range of about 50-60 μm may be used for a HV transistor with BV in the range of about 700-850 V. Other suitable dimensions for the $L_D$ may also be useful.

The device region includes a body well 114 disposed in the substrate. The body well serves as a body of the transistor. The body well encompasses the source region and extends laterally toward the drift well. In one embodiment, the body well abuts the drift well. In another embodiment, the body well may be separated from the drift well by a portion of the substrate. As shown, the body well extends from a bottom of the device isolation region 180 to under a portion of the gate 130. In one embodiment, the body well is deeper than the device isolation region and shallower than the drift well. For example, a depth of the body well may be about 2-3 μm. Other depths for the body well may also be useful. In one embodiment, the body well is doped with second polarity type dopants for a first polarity type device. For example, the body well may be doped with p-type dopants for a n-type device. Alternatively, the second polarity type dopants may be n-type for a p-type device. The dopant concentration of the body well may be light to intermediate. The dopant concentration of the body well should be chosen to provide the desired threshold voltage (i.e. turn-ON voltage) for the HV transistor. The doping and extent of the body well (i.e. lateral separation of the source and nearest edge of the drift well) should also be sufficient to prevent punch-through between the drift well and the source. For example, the dopant concentration of the body well may be about $1 \times 10^{16}$-$1 \times 10^{18}$/cm$^3$. In some embodiments, a retrograde body well may be useful. In a retrograde body well, the peak doping concentration is vertically disposed beneath the source to lower the resistance of this region for improved safe-operating area (SOA) without overly increasing the threshold voltage. Other dopant concentration for the body well may also be useful.

A length of a channel ($L_C$) of a transistor is equal to about the distance between the edge of the LDD (or source, if there is no LDD) and the edge of the drift well. The amount which the drift well and body well overlaps the gate may be selected to achieve the desire channel length. The channel length, for example, may be about 1 to 4 μm. Other channel lengths may also be useful. The length, for example, may depend on the technology.

A body well tap or contact 155 may be disposed within the body well. The body well tap may facilitate contacting and biasing the body well. The body well tap is a doped region. The body well tap, in one embodiment, is heavily doped with second polarity type dopants, the same type as the body well. For example, the body well tap is heavily doped p-type (p$^+$) region for a n-type transistor. The body well tap, for example, has a dopant concentration of about $1 \times 10^{18}$-$1 \times 10^{20}$/cm$^3$. Other dopant concentrations may also be useful. The depth of the body well tap may be the same or similar to the source. Other depths may also be useful. As shown, the body well tap is disposed adjacent to the source. In one embodiment, the source and body well tap regions are electrically shorted by a silicide layer and/or metal contact and/or metal electrode. This minimizes the resistance of the body well region extending under the source between the body well tap and the farthest edge of the source, which may improve the SOA of the HV transistor. Other configurations may also be useful. In another embodiment, a STI region may be disposed between the body well tap and source. This arrangement allows the source voltage to be different than the body well tap voltages, such that the source may provide current to circuit elements connected between the source and body well tap (e.g. ground potential).

In one embodiment, the device region includes a buried RESURF region 116. The buried RESURF region is disposed within the drift well. The buried RESURF region is a doped region. The buried RESURF region, in one embodiment, is an intermediately doped region with second polarity type dopants, the opposite type as the drift well. The dopant concentration of the drift well and buried RESURF region should be selected to achieve the best OFF-state and ON-state performance of the transistor. In the OFF-state, the HV transistor should support a high applied voltage (up to BV) between the drain and source. The buried RESURF region and drift well are designed so that they are substantially mutually depleted of free carriers with a relatively low applied drain voltage. This mutual depletion technique is referred to as Reduced Surface Field (RESURF) and it reduces the electric fields in the HV transistor and allows for high BV to be achieved. Proper RESURF requires a careful balance of the N-type and P-type dopants in the drift well and buried RESURF region. For example, the integrated net charge in the portion of the drift well underlying the buried RESURF region may be about 1.5-2.5 E12/cm$^2$, and integrated net charge in the buried RESURF region may be about 0.5-1.5 E12/cm$^2$. Other dopant concentrations may also be useful.

In one embodiment, the buried RESURF region is disposed under the internal STI region. In one embodiment, the buried RESURF region may be contiguous with the internal STI region. As shown in FIGS. 1a and 1c, the buried RESURF region 116 may extend laterally beyond edges of the internal STI region 184. The use of STI as the internal dielectric region over the drift well, which produces a planar surface, results in the buried RESURF region which extends beyond the edges of the internal STI region to be at the same level as the portion under the internal STI region. This effectively enables the buried RESURF region to extend beyond the edges of the STI without a substantial change in the vertical depth of the buried RESURF region, which would upset the charge balance between the RESURF region and the drift well. This ability to extend the buried RESURF region enables effective reduction of electric fields that are caused by the material discontinuities at edges of the internal STI region. Therefore, the use of a STI region as the internal dielectric region with an underlying buried RESURF region provides for a device with improved BV and reliability.

Figure 1B:
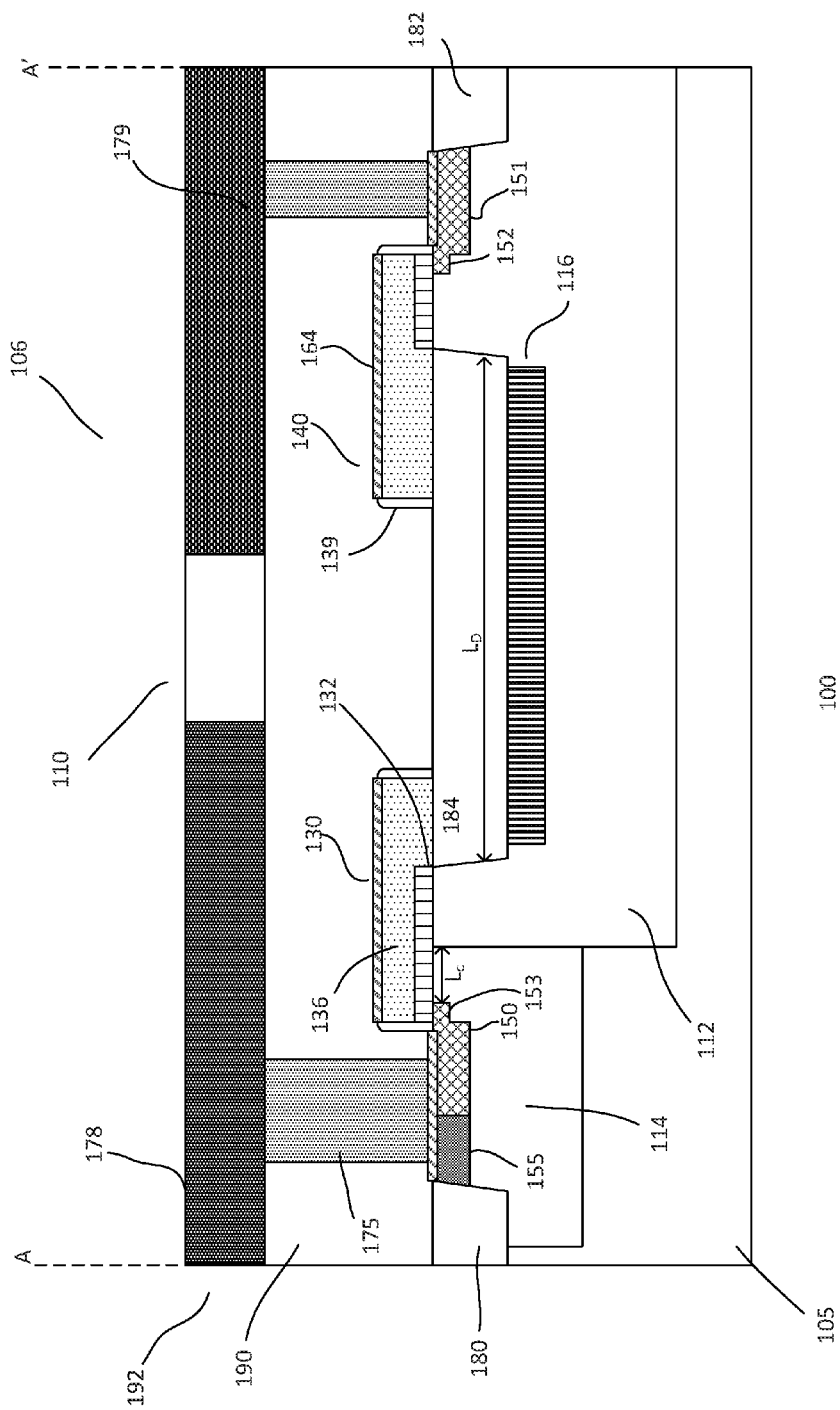
Figure 1C:
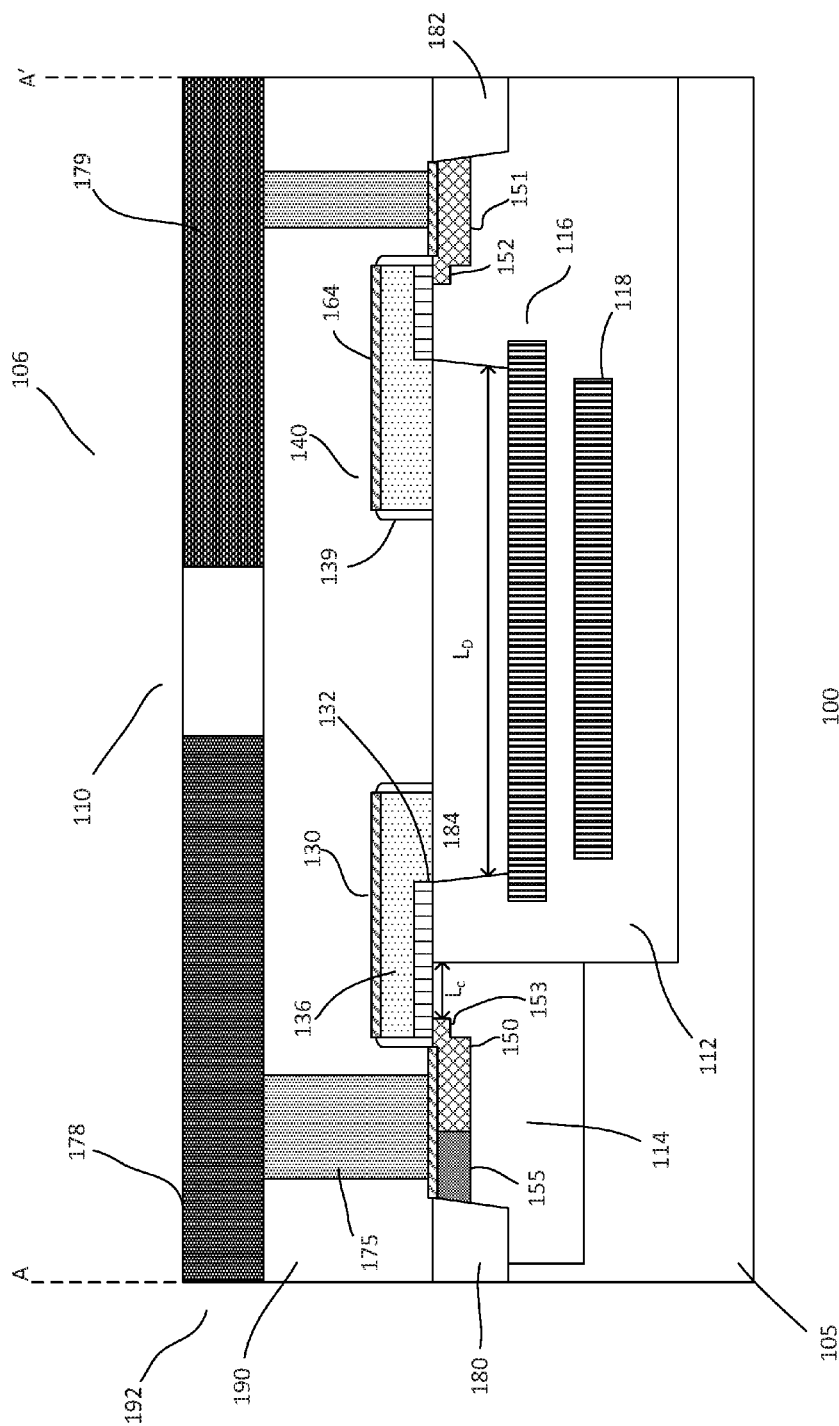
Figure 1D:
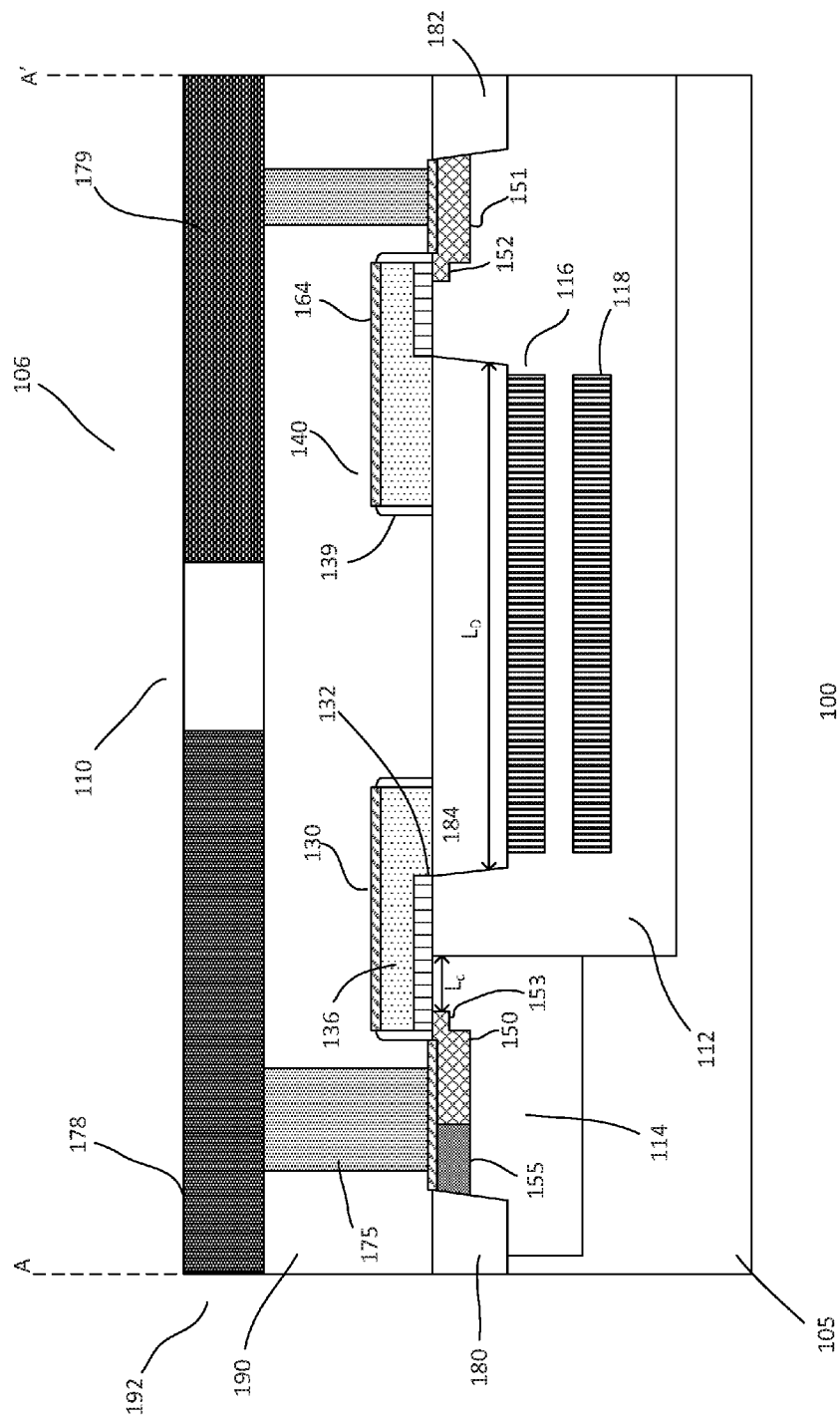

In alternative embodiments, as shown in FIGS. 1b and 1d, the buried RESURF region 116 may be disposed between the edges of the internal STI region. Other configurations of the buried RESURF region may also be useful. For example, one edge may extend beyond the edge of the internal STI region while the other is within the edge of the internal STI region.

In other embodiments, additional buried RESURF regions may be provided in the drift well. For example, as shown in FIGS. 1c and 1d, first and second buried RESURF regions 116 and 118 are provided. The first buried RESURF region 116 is disposed below and contiguous with the internal STI region while the second buried RESURF region 118 is disposed below and displaced a distance away from the bottom of the first buried RESURF region. The introduction of the second buried RESURF region allows the total net charge of the drift well to be increased, which improves the ON-state performance of the device (e.g. higher current and lower resistance) without sacrificing OFF-state performance (BV). As discussed previously, the charge balance among the two buried RESURF regions and the drift well are important for achieving proper RESURF. For example, the integrated net charge in the first buried RESURF region may be about 0.5-1.5 E12/cm$^2$, the integrated net charge in the portion of the drift well between the first and second buried RESURF regions may be about 1.5-2.5 E12/cm$^2$, the integrated net charge in the second buried RESURF region may be about 1.5-2.5 E12/cm$^2$ and the integrated net charge in the portion of the drift well underlying the second buried RESURF region may be about 1.5-2.5 E12/cm$^2$. The vertical separation distance between the first and second buried RESURF regions may be about 0.5-1.5 µm. Other distances may also be useful. Additional buried RESURF regions may also be provided to further improve the ON-state performance of the transistor for a given BV rating.

The edges of the buried RESURF region need not be aligned. For example, as shown in FIG. 1c, the second buried RESURF region is narrower than the first buried RESURF region. As shown, the second buried RESURF region, for example, has a greater lateral separation from the source compared to a lateral separation of the first buried RESURF region from the source. This may provide more design freedom to enhance the RESURF and improve performance. Alternatively, as shown, in FIG. 1d, the edges of the buried RESURF regions may be aligned, such that they can be formed using a single masking step for reduced process cost. Other configurations of buried RESURF regions may also be useful.

Referring back to FIGS. 1a-1d, the terminals or contact regions of the transistor include metal silicide contacts 164. For example, the metal silicide contacts may be disposed on the source, drain, body well tap, DFP, and gate. The metal silicide contacts, for example, may be cobalt silicide (CoSi). Other types of metal silicide contacts may also be useful. For example, the metal silicide contact may include titanium, nickel, or other suitable silicide materials. The silicide contacts may be about 50-500 Å thick. Other thicknesses may also be useful.

In one embodiment, the metal silicide contacts 164 are selectively formed on exposed silicon material during the fabrication process. For example, metal silicide contacts may be formed simultaneously on the exposed source, drain, body well tap, DFP, and gate electrode regions. Front-end-of-line processing, for example, may be completed after silicide formation. The metal silicide contacts may be employed to reduce contact resistance and facilitate contact to the back-end-of-line (BEOL) metal interconnects.

A dielectric layer 190 may be provided over the transistor. The dielectric layer serves as, for example, an inter-level dielectric (ILD) or pre-metal dielectric (PMD) layer, which commences BEOL processing. The dielectric layer, for example, may be silicon oxide. Other types of dielectric materials may also be useful. Via contacts 175, such as tungsten contacts, may be formed in the PMD layer coupling the terminals or contact regions of the transistors to metal electrodes.

In some embodiments, a dielectric etch stop layer (not shown) is formed over the transistors. The etch stop layer, for example, is a silicon nitride etch stop layer. Other types of etch stop layers may also be useful. The etch stop layer should have a material which can be selectively removed from a dielectric layer thereover. The etch stop layer facilitates in forming contact plugs to contact regions of the transistor. In some embodiments, the etch stop layer may also serve as a stress layer for applying a stress on the channel of the transistor to improve performance.

The process may continue with BEOL processing. For example, a conductive layer 192 may be formed over the PMD layer. The conductive layer may be aluminum or copper and may include a stack of conductive layers including barrier metals such as titanium alloys. Other types of conductive layers may also be useful. The conductive layer, for example, serves as a first metal level (M1) of the device. Electrodes such as source electrode 178 and drain electrode 179, may be formed in a dielectric layer disposed over the PLAID layer. The metal electrodes may be formed using, for example, metal deposition and etching and/or damascene techniques. Other techniques for forming the source and drain electrodes may also be useful.

Additional interconnect levels (not shown) may be formed over the first metal level. An additional interconnect level, for example, includes contacts in a via level and interconnects in a metal level of an inter-metal dielectric (IMD) layer. After the top interconnect level is formed, a passivation layer (not shown) may be formed. The passivation layer includes a suitable dielectric layer such as silicon oxide, silicon nitride, or a combination of dielectric materials. Pad openings are formed in the passivation layer to provide for external electrical connections via, for example, wire bonding or bumping. Thereafter, dicing, assembly and packaging may be performed. Other processes or alternative processes may also be included to complete the device.

Figure 1F:
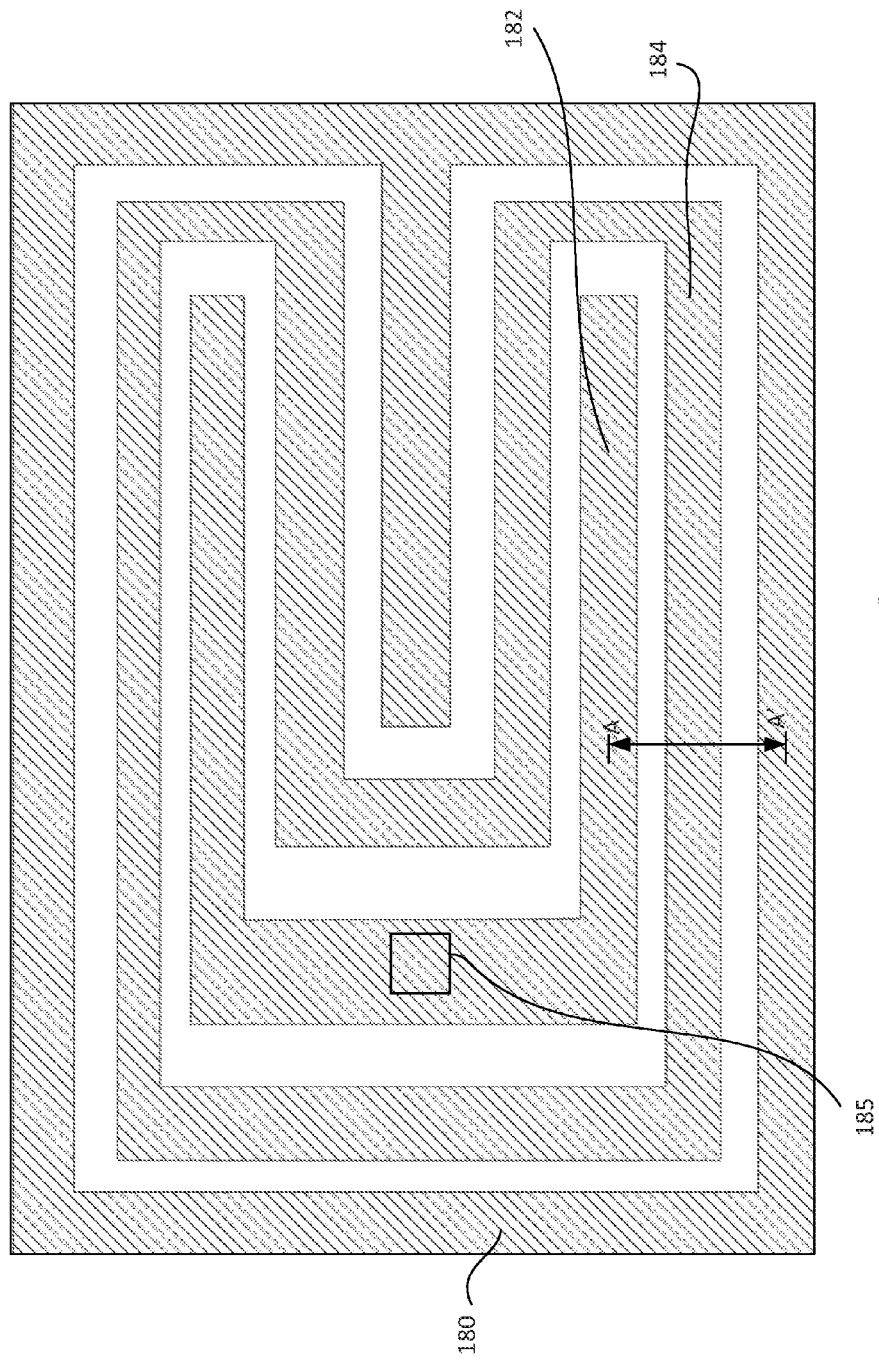

FIG. 1e shows a simplified top view of an embodiment of a HV transistor 110 while FIG. 1f shows a simplified top view of another embodiment of a HV transistor. For the sake of clarity, only the isolation regions 180 and 182, and internal STI region 184, are shown. Cross-section A-A' are marked to show how cross-sectional views of FIGS. 1a-1d to the top-view drawings.

FIG. 1e shows a HV transistor with a racetrack layout. The internal STI region 184, for example, has a racetrack (i.e. elongated doughnut) shape. The total channel width of HV transistor is approximately the perimeter of the outermost portion of this STI region. As shown, the device isolation region 180 (on the source side of HV transistor 110) completely surrounds the HV transistor 110 and isolates it from other circuitry, such as LV transistors, formed in the same substrate 105. Device isolation region 182 (on the drain side of HV transistor 110), as shown, is completely enclosed by internal STI region 184. A bond pad opening 185, for example, formed in the passivation layer may provide direct contact to the drain electrode, by wire bonding or bumping, thus avoiding the need to route a high voltage drain electrode over the internal STI region, which may upset the RESURF and degrade the BV and/or reliability of the transistor.

FIG. 1f shows a HV transistor with a finger-type layout. The internal STI region 184, for example, forms one or more fingers, of which the internal STI fingers have a much greater length (e.g. hundreds of microns) than width (e.g. 20-100 microns). Other suitable length and width dimensions may also be useful. The total channel width of HV transistor is approximately the perimeter of the internal STI region. As shown, the device isolation region 180 (on the source side of HV transistor 110) completely surrounds the HV transistor 110, isolating it from other circuitry, such as LV transistors, formed in the same substrate 105, and also extends into the STI region fingers in an interdigitated manner. The device isolation region 182 (on the drain side of HV transistor 110), for example, is completely enclosed by internal STI region 184. A bond pad opening 185, for example, formed in the passivation layer may provide direct contact to the drain electrode, by wire bonding or bumping, thus avoiding the need to route a high voltage drain electrode over the internal STI region, which may upset the RESURF and degrade the BV and/or reliability of the transistor. The shapes in FIGS. 1e and 1f are shown as being rectangular, with square corners, for simplicity. In preferred embodiments, the corners may be rounded to reduce electric field crowding and provide higher BV.

Figure 2B:
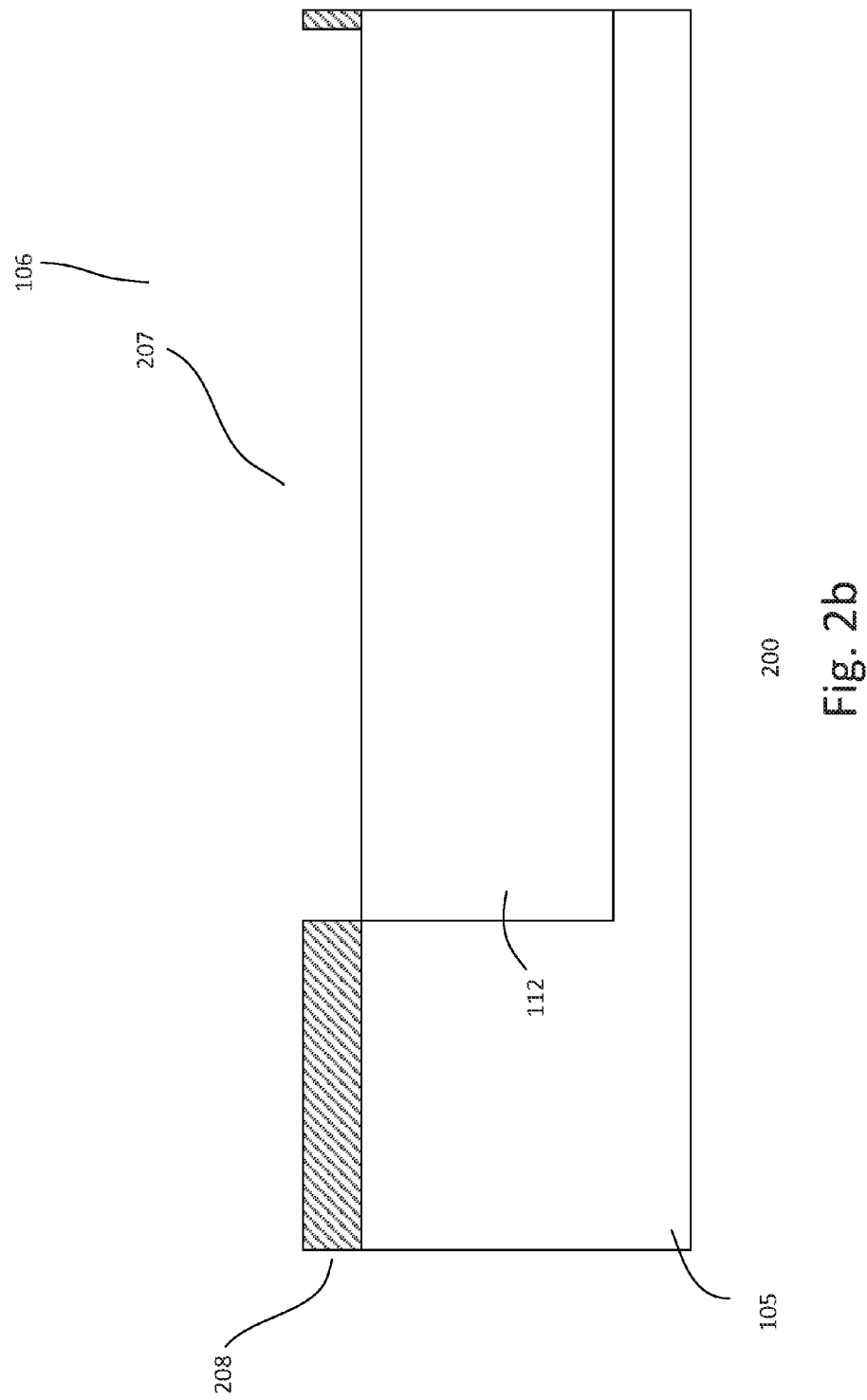
FIGS. 2a-2n show cross-sectional views of an embodiment of a process for forming a device.
Figure 2C:
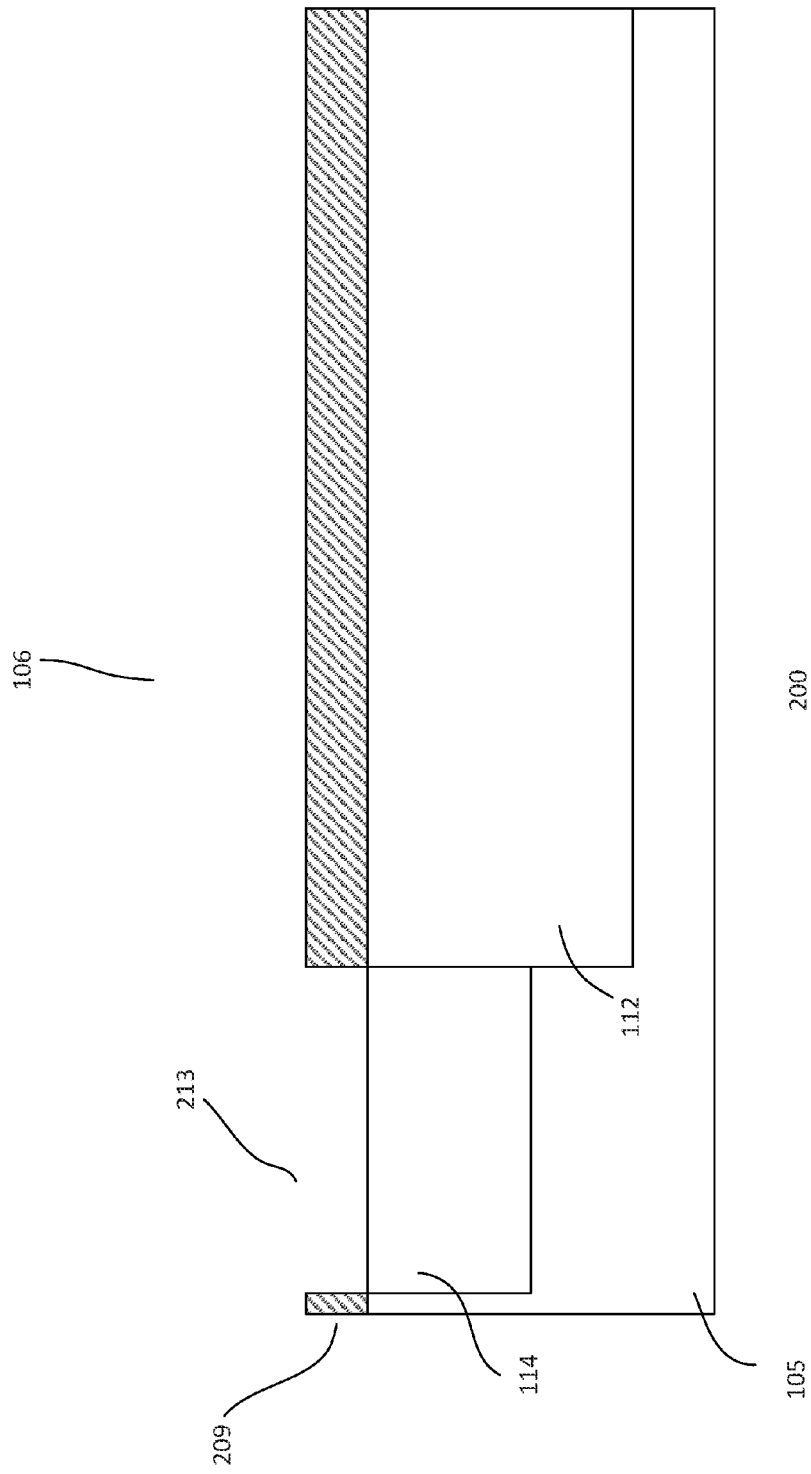
Figure 2D:
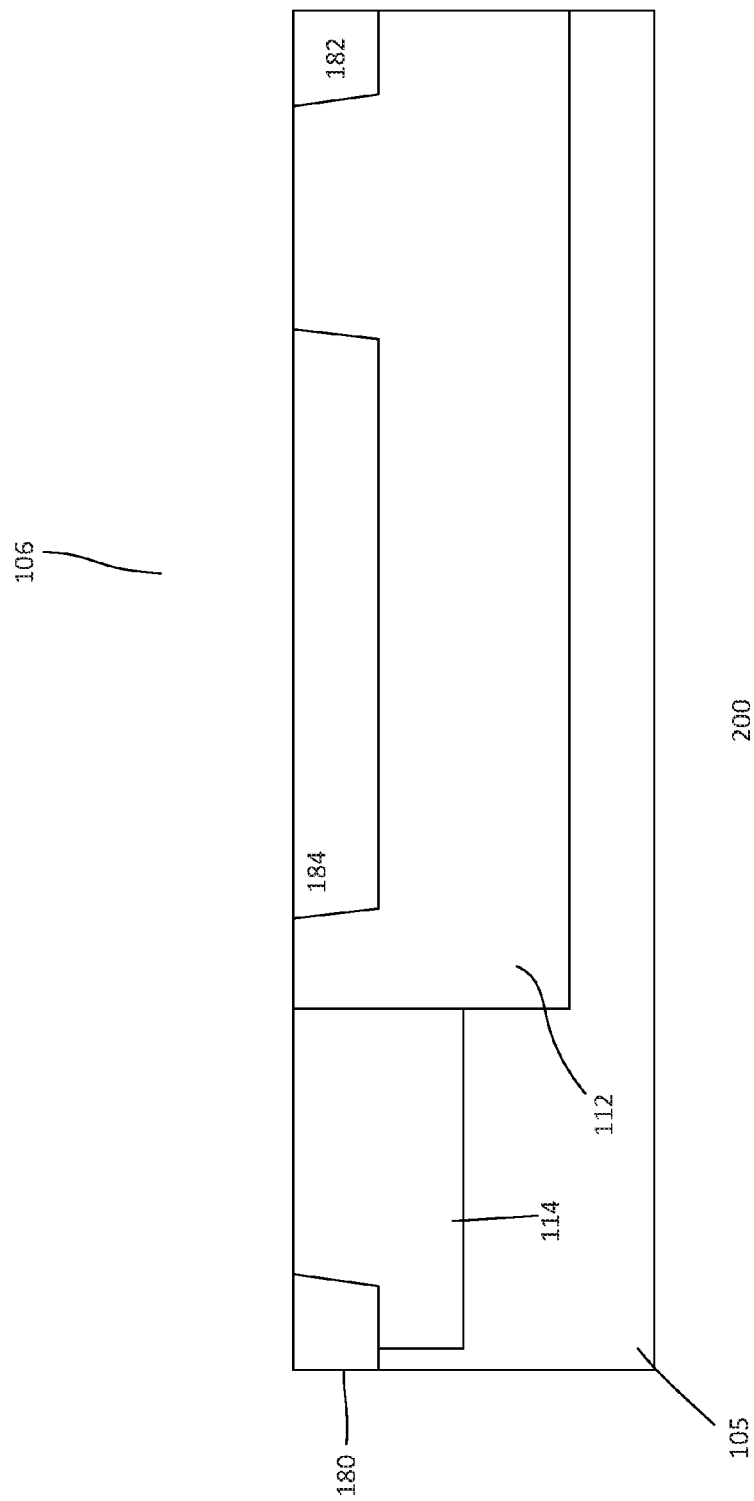
Figure 2E:
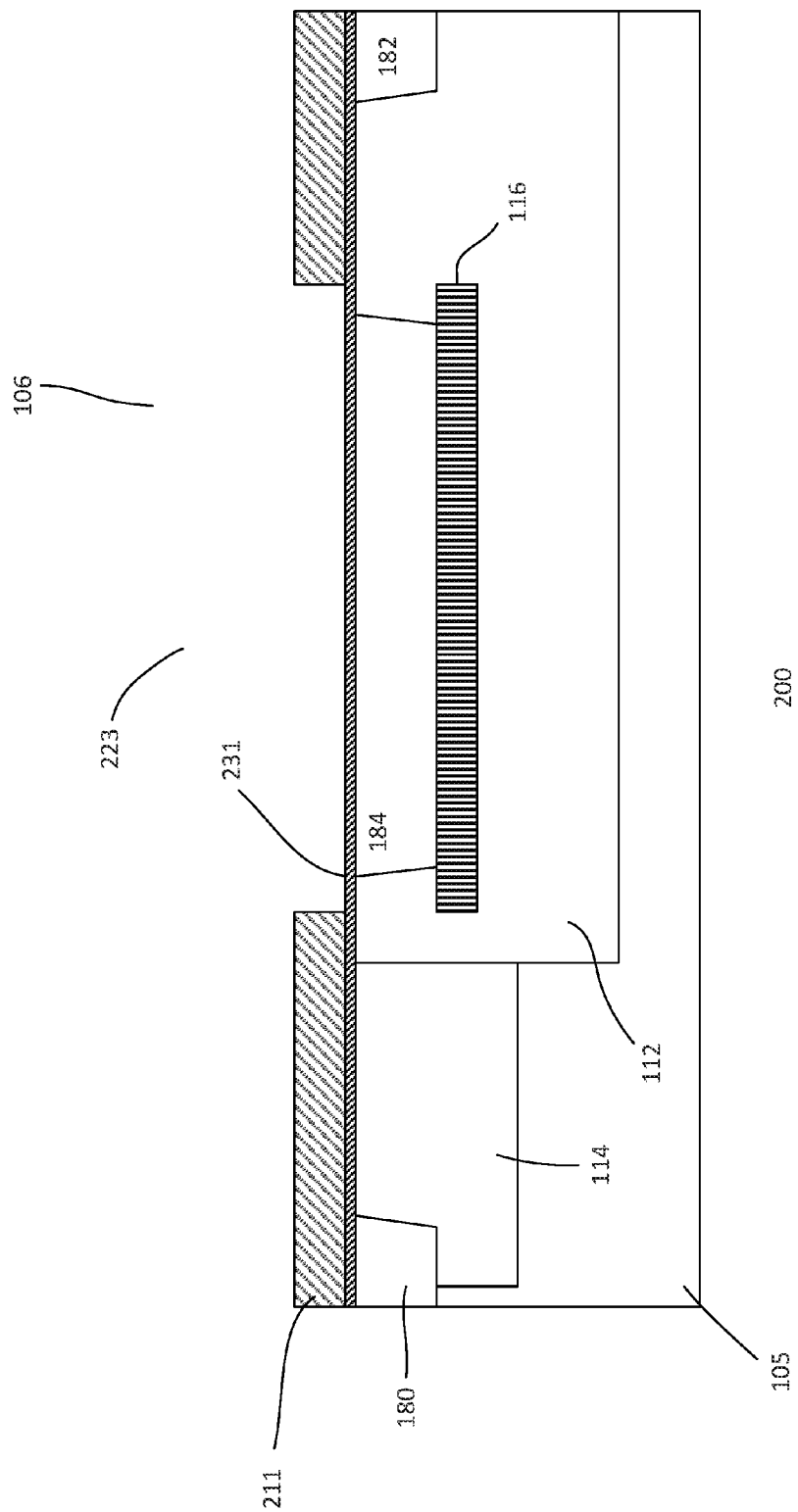
Figure 2F:
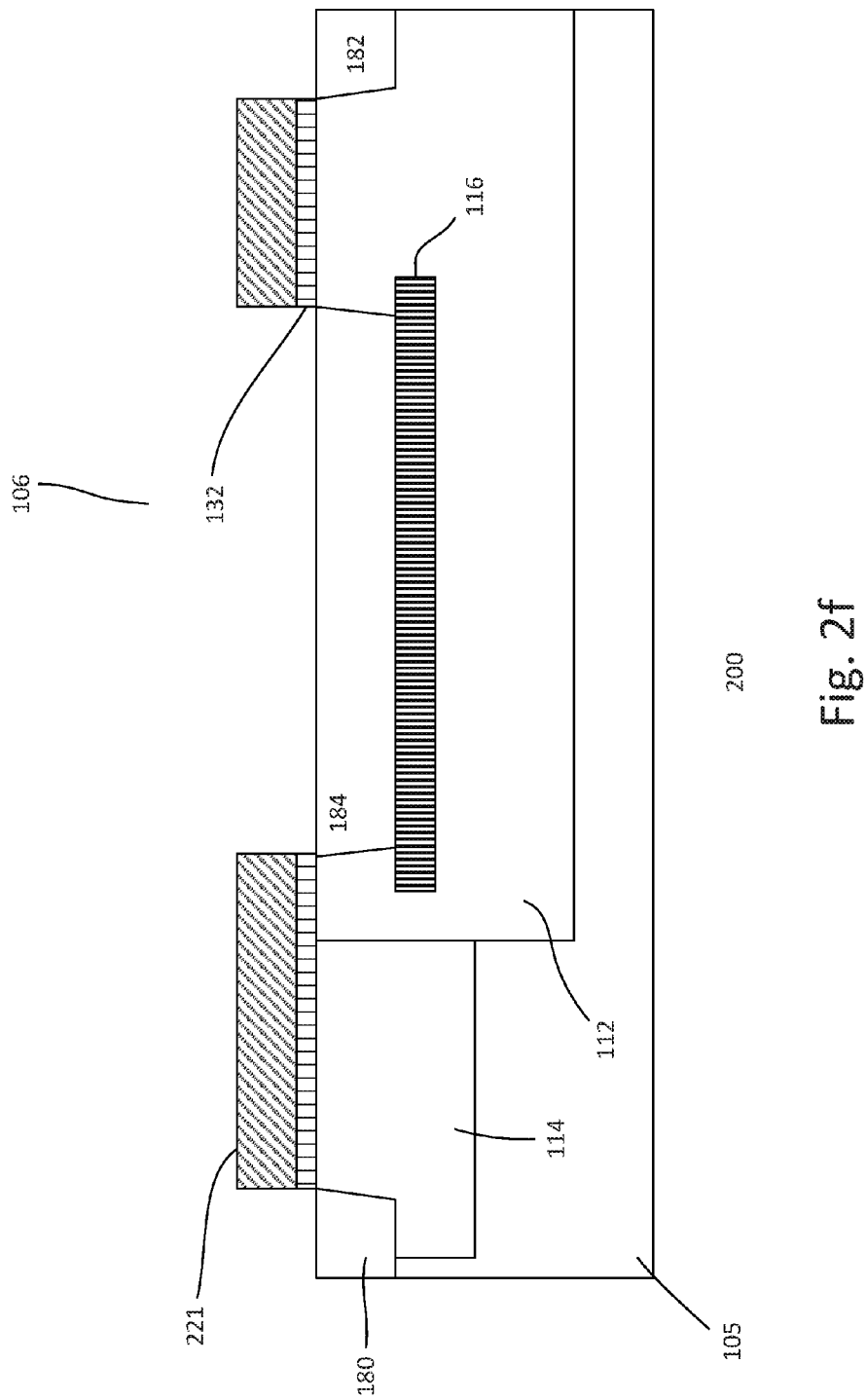
Figure 2G:
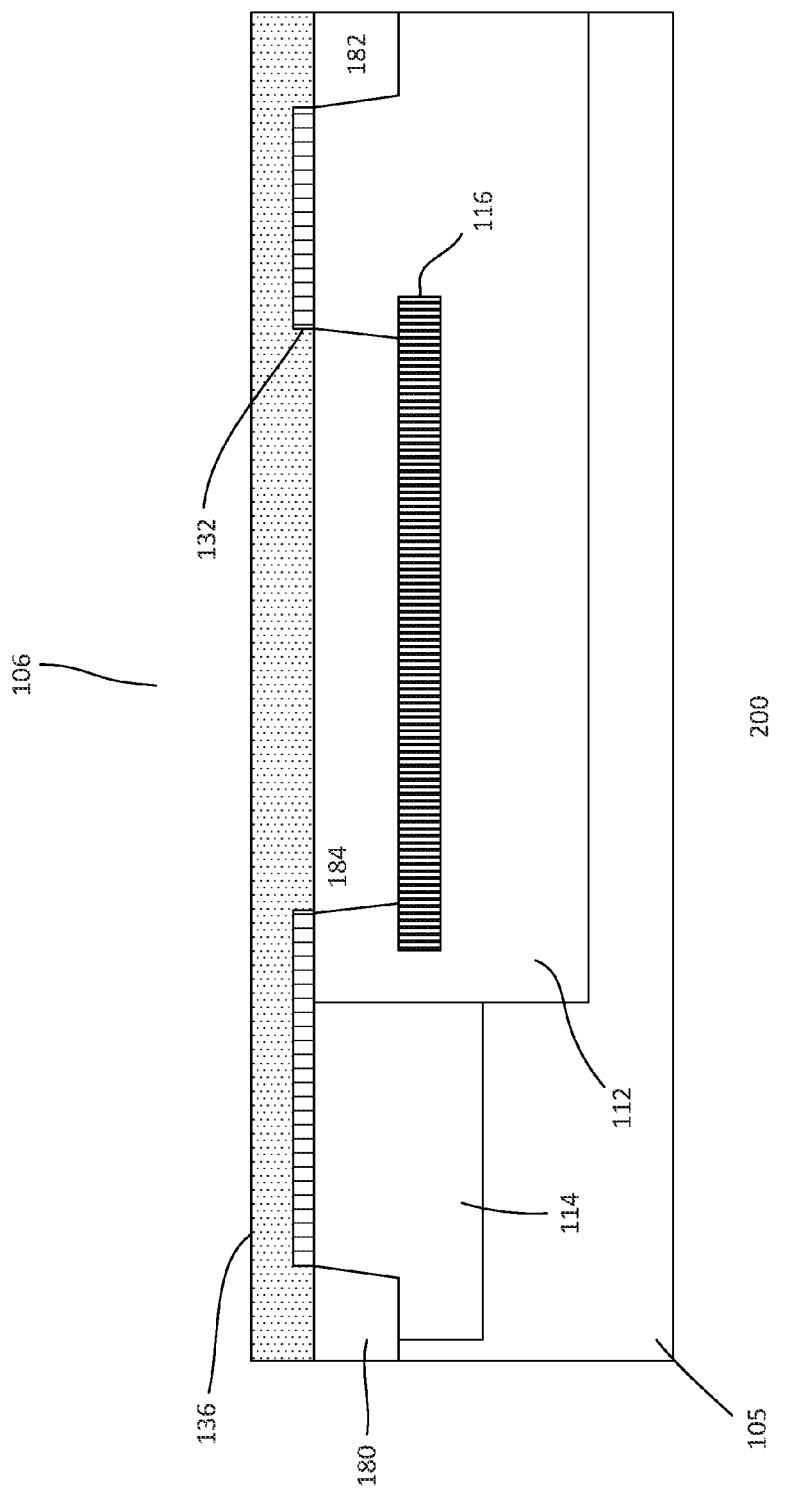
Figure 2H:
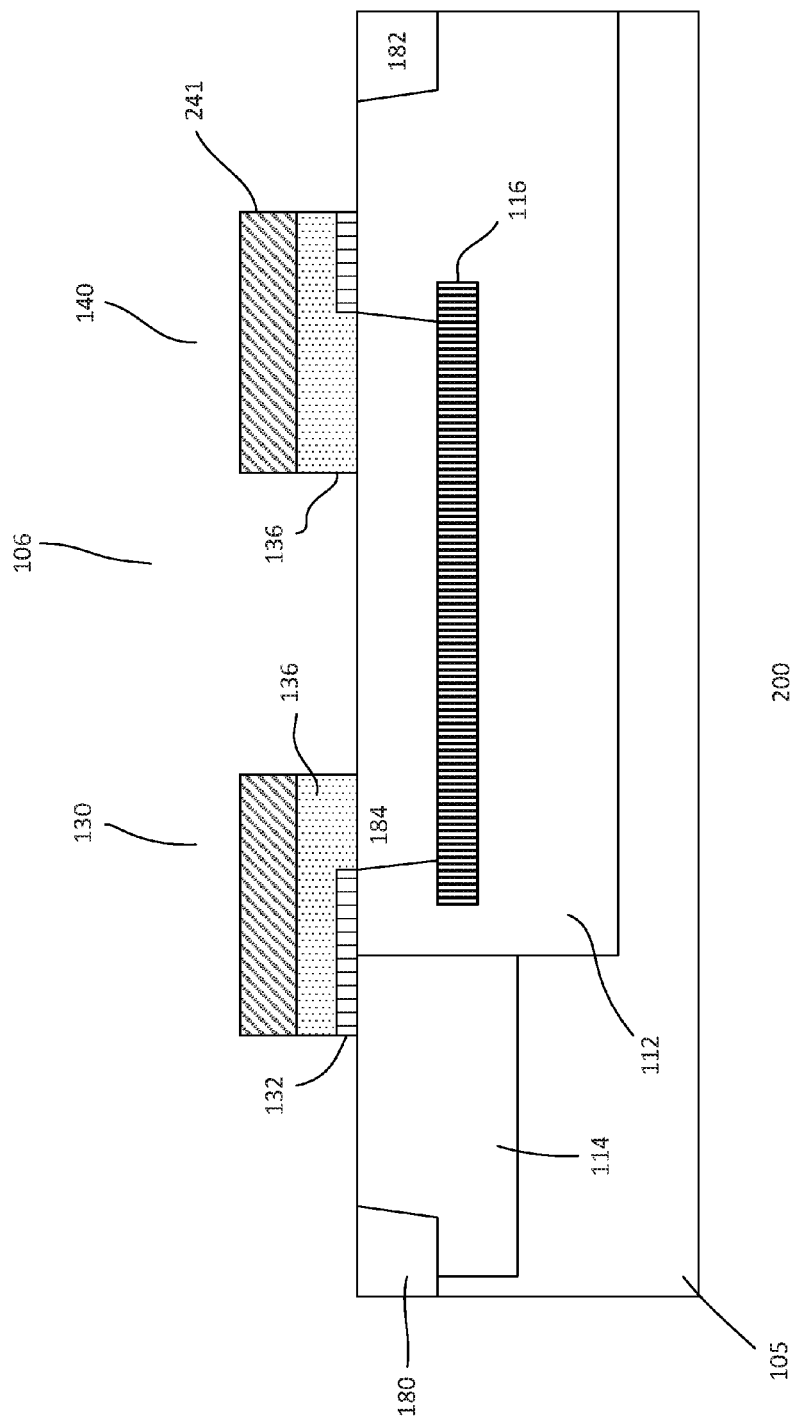
Figure 2I:
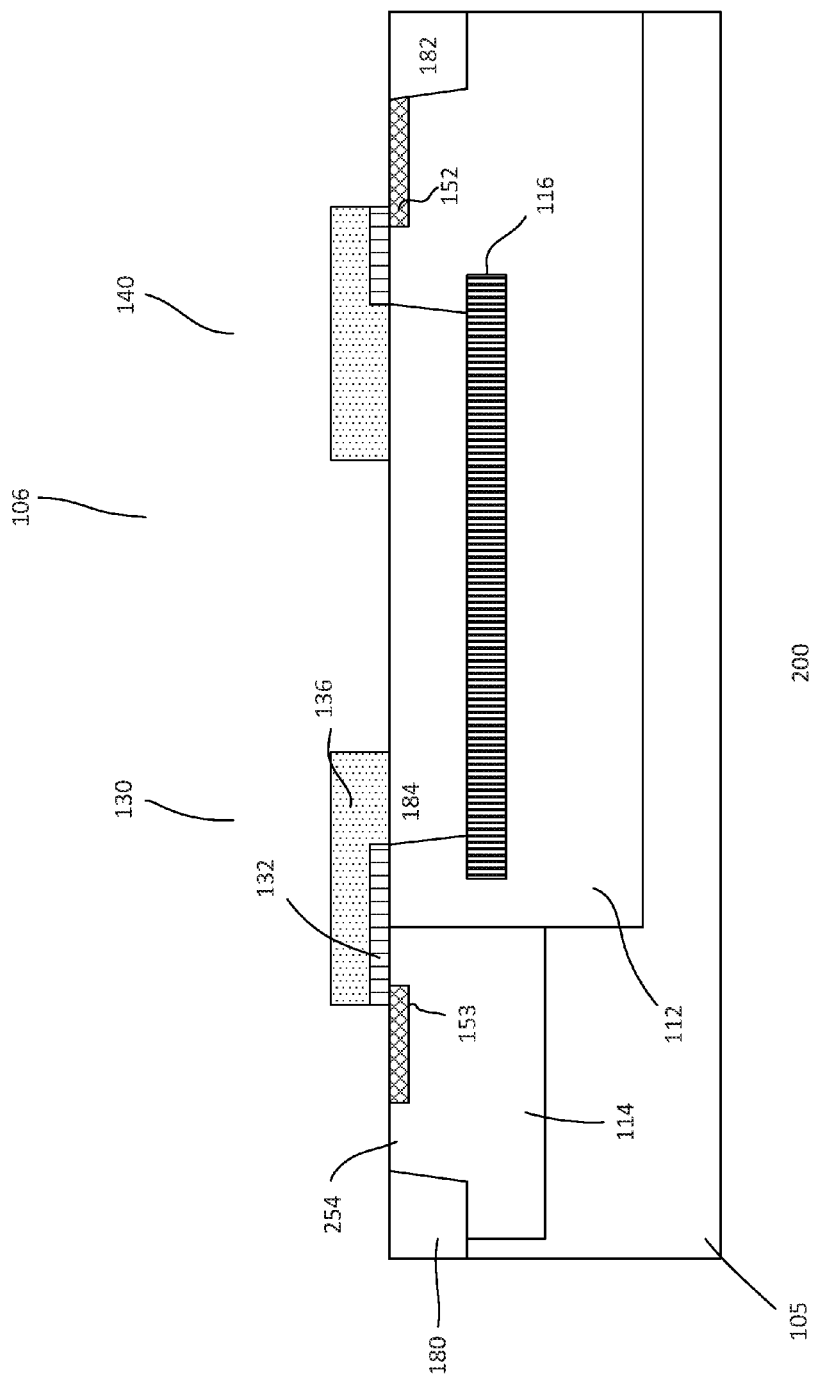
Figure 2J:
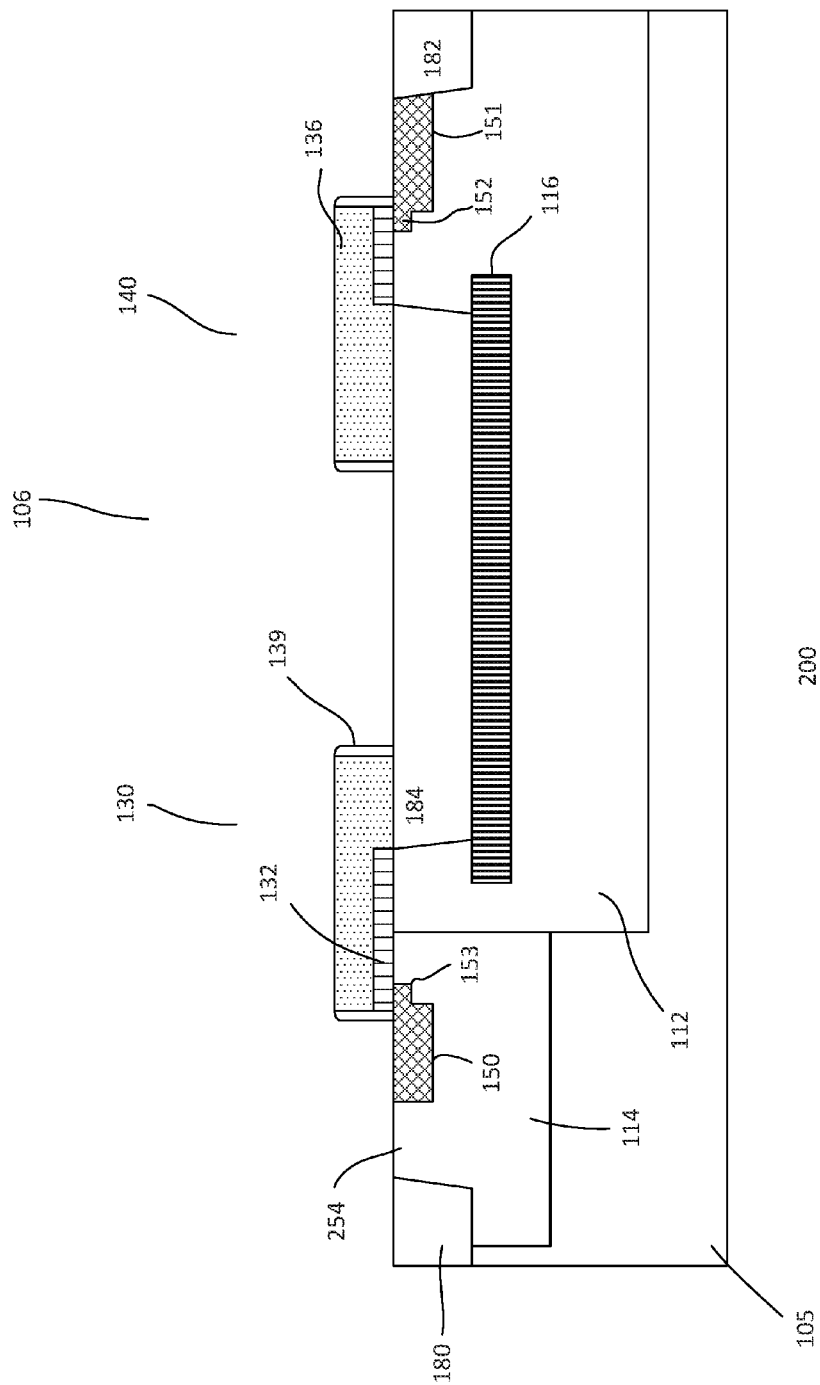
Figure 2K:
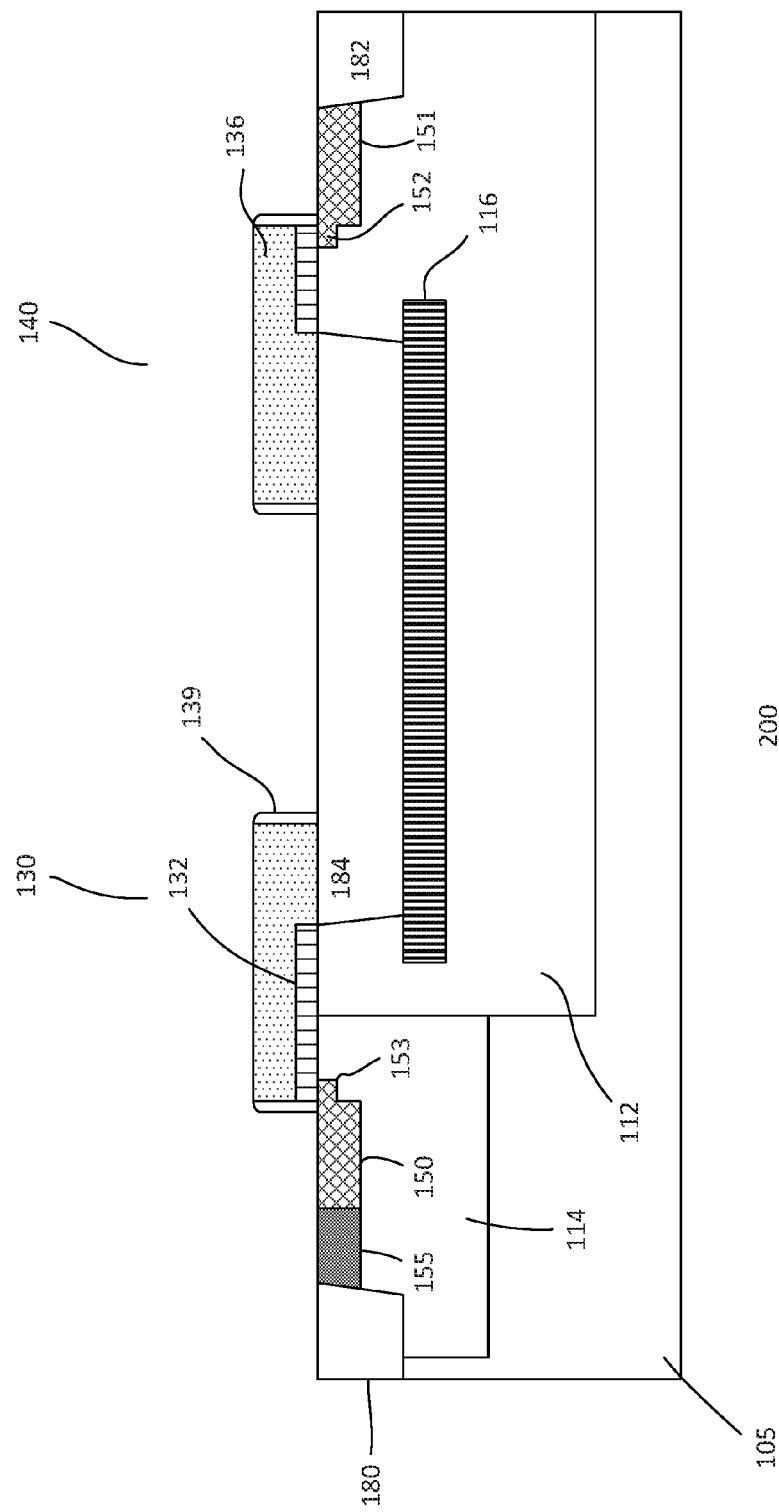
Figure 21:
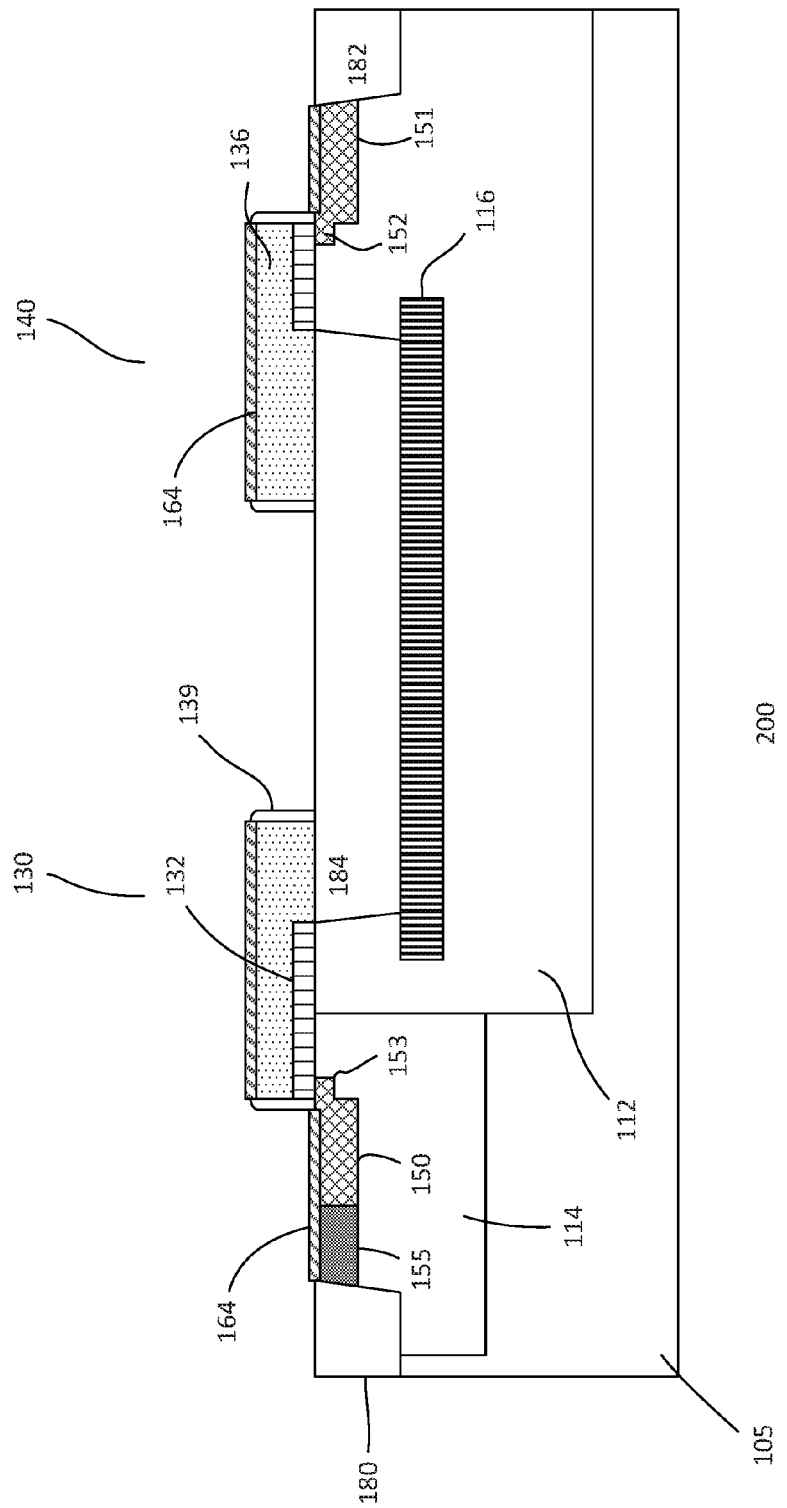
Figure 2M:
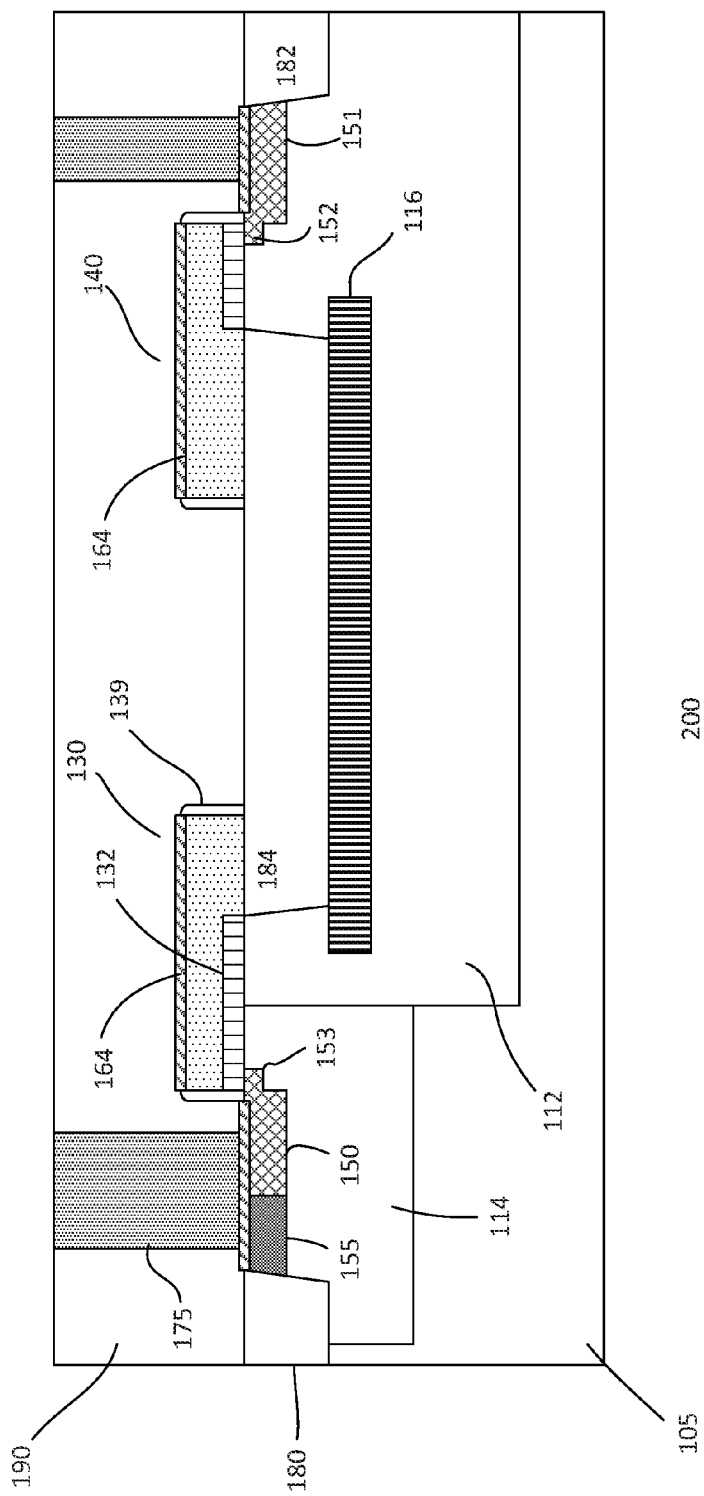
Figure 2N:
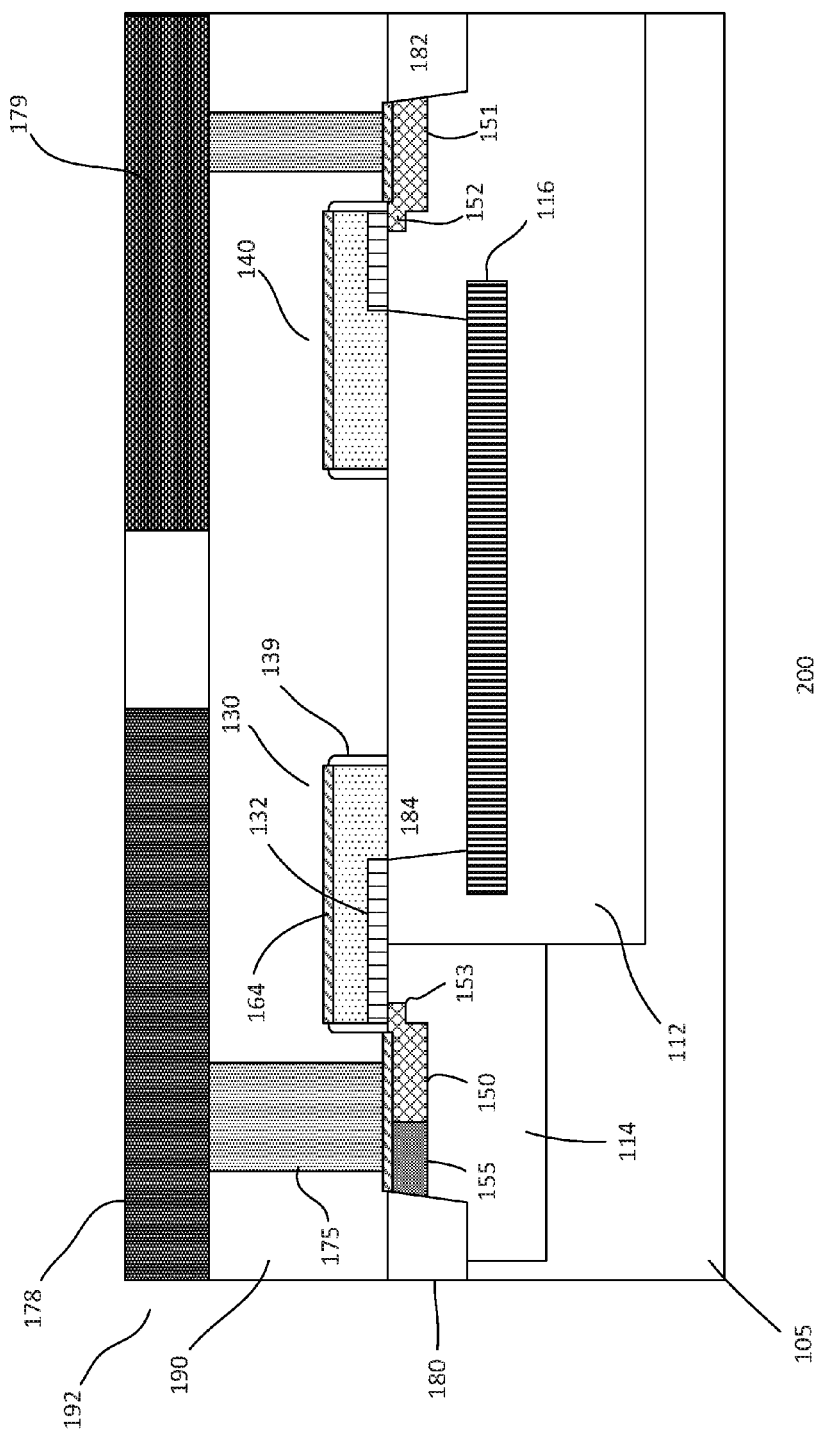

FIGS. 2a-2n show cross-sectional views of an embodiment of a process 200 for forming a device. The cross-sectional views are along a channel length direction of the device. The process 200 as will be described is highly compatible with CMOS processing. Referring to FIG. 2a, a substrate 105 is provided. The substrate, in one embodiment, is a silicon wafer. The substrate may be a doped substrate, such as a p⁻ substrate. Other types of substrates, such as a germanium-based, gallium arsenide, COI such as SOI, or sapphire, may also be useful. The substrate may be doped with other types of dopants or dopant concentrations. Providing an undoped substrate may also be useful.

The substrate includes a HV device region 106. In one embodiment, the device region is an UHV device region. The substrate may also include device regions not show for other types of circuitry, depending on the type of device or IC. For example, the device may also include regions for HV, intermediate voltage (IV) or medium voltage (MV) and low voltage (LV) devices as well as an array region for a plurality of interconnected memory devices. Providing other types of device regions within the substrate may also be useful.

In FIG. 2b, a drift well 112 is formed. Forming the drift well, for example, includes forming a pad oxide (not shown) on the substrate. The pad oxide, for example is silicon oxide formed b thermal oxidation. The pad oxide, for example, serves as an implant screen for a dopant implantation process. The pad oxide, for example, may be about 100 Å thick. Other thicknesses may also be useful.

An implant mask 208 is formed on the substrate. The implant mask, for example, includes a photoresist layer. The photoresist or implant mask is patterned to form an opening 207, exposing the substrate where the drift well is to be formed. To pattern the photoresist layer, a lithographic exposure source selectively exposes the mask layer. The exposed mask layer is developed to form the opening.

In one embodiment, an implant is performed using the implant mask. The implant implants or dopes the substrate with first polarity type dopants, forming the drift well. After implantation, the implant mask 208 is removed. For example, the implant ask may be removed by ashing. Other techniques for removing the implant mask may also be useful. A high-temperature process is used to diffuse the implanted dopant atoms into the substrate 105. For example, a furnace anneal step with a temperature of about 1200° C. and a duration of about 5 hours may be used to for a drift well with a depth of, for example, about 6-10 μm. Other depths for the drift well may also be useful. The drift well implantation may preferably be performed at a high energy to introduce the dopant atoms at some distance below the silicon surface, thus minimizing the required annealing time. Multiple implants may also be performed, for example with different doses and energies, to produce the drift well with the desired depth and dopant profile. The drift well implant dose, for example, may be about $1 \times 10^{12}$-$1 \times 10^{14}$/cm². Other implant dose for the drift well may also be useful.

As shown in FIG. 2c, a body well implant mask 209, such as photoresist, is formed on the substrate. The implant mask is patterned to form an opening 213, exposing the substrate where the body well is to be formed. In one embodiment, the body well is formed such that it abuts the drift well. In another embodiment, the body well may be formed such that it is separated from the drift well by a portion of the substrate. An implant is performed using the body well implant mask. The implant introduces atoms with second polarity type dopants to form the body well 114. After implantation, mask 209 is removed. A high-temperature process is used to diffuse the implanted dopant atoms into the substrate 105. For example, a furnace anneal step with a temperature of about 1000° C. and a duration of about 2 hours may be used to form a body well having a depth of, for example, about 2-3 μm. Other depths for the body well may also be useful. The body well implantation may preferably be performed at a high energy to introduce the dopant atoms at some distance below the silicon surface, thus minimizing the required annealing time. Multiple implants may also be performed, for example, with different doses and energies, to produce the drift well with the desired depth and dopant profile. The implant dose of body well may be about $1 \times 10^{13}$-$1 \times 10^{15}$/cm². In some embodiments, a retrograde body well may be formed. In a retrograde body well, the peak dopant concentration is vertically formed beneath the source to lower the resistance of this region for improved safe operating area (SOA) without overly increasing the threshold voltage. Other implant dose for the body well may also be useful.

Referring to FIG. 2d, isolation regions 180 and 182 and internal dielectric region 184 are formed on the substrate. The isolation regions and internal dielectric region may be formed in configuration as described with respect to FIG. 1e or FIG. 1f. Other suitable configurations may also be useful. The isolation regions and internal dielectric region formed in the HV device region may be simultaneously formed with isolation regions in other device regions of the same substrate.

The isolation regions and the internal dielectric region are, for example, STI regions. Various processes can be employed to form the STI regions. For example, the substrate can be etched using etch and mask techniques to form trenches. The mask, for example, includes a pad oxide and silicon nitride hard mask which is patterned using a patterned photoresist mask. The substrate is etched using, for example, an anisotropic etch, such as a reactive ion etch (RIE) to form the trenches. Other techniques for patterning the substrate may also be useful. The trenches are then filled with dielectric materials such as silicon oxide. In one embodiment, the dielectric material includes high temperature oxide (HTO). Chemical mechanical polishing (CMP) can be performed to remove excess oxide and provide a planar substrate top surface. Other processes or materials can also be used to form the STIs. The depth of the STI regions may be, for example, about 3000-5000 Å. Other depths for the STI regions may also be useful.

In one embodiment, the CMP process produces a planar surface with the STI regions and nitride hard mask. An oxide removal process may be performed to recess the top surface of the STI regions followed by a hard mask strip. Thereafter, a thermal oxide process may be performed to form a pad oxide 231 over the substrate surface. The pad oxide, for example, serves as a screening oxide layer for the subsequent implant step.

A buried RESURF mask layer 211 is formed on the substrate. For example, the mask layer is formed over the pad oxide layer 231. The mask layer, for example is a photoresist layer. The mask layer is patterned to form an opening 223, exposing the substrate where a buried RESURF region 116 is to be formed. An implant is performed using the patterned mask layer. The implant implants second polarity type dopants which serve as dopants for the buried RESURF region. The RESURF implantation may preferably be performed at a high energy to introduce the dopant atoms below the bottom surface of the internal dielectric region. The implant doses should be chosen to provide the proper charge balance as discussed above with respect to FIG. 1a. The implant energy should be chosen to place most of the implanted atoms below the internal dielectric region. For example, boron atoms may be implanted with a dose of about $5\times10^{11}$-$5\times10^{12}$/cm$^3$ and energy of about 300-600 keV, to produce the buried RESURF region with the desired depth and dopant profile. After implanting the dopants, the implant mask is removed. For example, the implant mask may be removed by ashing. Other techniques for removing the implant mask may also be useful. An anneal is performed on the substrate. The anneal activates the second polarity dopants, forming the buried RESURF region. The junction depth of the RESURF region may be in the range of about 0.2-1.0 microns.

In other embodiments, additional buried RESURF regions may be provided in the drift well. For example, a second buried RESURF region 118 (not shown) may be formed below and displaced a distance away from the bottom of the first buried RESURF region. To form the second buried RESURF region, boron atoms may be implanted with a dose of about $1\times10^{12}$-$5\times10^{12}$/cm$^2$ and energy of about 2000-3000 keV may be used, for example, to provide the proper charge balance with the drift well. The vertical separation distance between the first and second buried RESURF regions may be about 0.5-1.5 μm. Other distances may also be useful. Additional buried RESURF regions may also be provided to further improve the ON-state performance of the HV transistor for a given BV rating. The first RESURF region, second RESURF region, and additional buried RESURF regions may be implanted using the same mask layer 211, to save processing cost. Alternatively, additional mask layers may be used to define one or more buried RESURF regions, allowing more flexibility in the design of the drift region.

The buried RESURF layers may be patterned to form a buried RESURF regions, as described in FIGS. 1a-1d. For example, the buried RESURF region 116 is formed under and contiguous with the internal dielectric region 184 and may extend beyond the edges of the internal dielectric region, within the edges of the internal dielectric region or one end extending beyond an edge of the internal dielectric region while the other end is within an edge of the internal dielectric region. Providing a buried RESURF mask which forms other configurations of the buried RESURF region may also be useful.

Various wells for other device regions may be formed. Multiple implant processes may be performed to form the various wells of the other device regions. For example, wells for different regions and different polarity type devices may be formed using separate implant processes. Anneals may be performed to activate the dopants of the wells.

The process continues to form gate dielectric for the transistor, as shown in FIG. 2f. The process may include forming gate dielectric layers for transistors of different device regions. For example, the process includes forming transistors for HV (including UHV) and LV regions.

The process, for example, includes removing the sacrificial oxide layer 231. Removal, for example, may be achieved with a wet etch or other suitable technique. A surface clean may be performed to prepare the substrate for forming a gate dielectric layer. In one embodiment, a HV gate dielectric layer is formed on the substrate. The HV gate dielectric layer includes suitable dielectric materials, such as silicon oxide and silicon nitride. The HV gate dielectric layer, for example, may be formed by thermal oxidation and/or chemical vapor deposition (CVD) and/or another suitable technique. The thickness of the HV gate dielectric layer may be about 100-1000 Å. After forming the HV gate dielectric layer, the substrate may annealed in a nitrogen ambient improve the quality of the gate dielectric.

The HV gate dielectric layer may be patterned. For example, a resist mask 221 may be used to remove HV gate dielectric layer in regions other than the HV device region. This leaves the HV gate dielectric 132 in the HV device region. The HV gate dielectric layer may be removed using a dry etch and/or a wet etch. Other techniques for patterning the HV gate dielectric layer may also be useful. After patterning the HV gate dielectric layer, the resist mask is removed and a clean step is performed. A LV gate oxide is formed by, for example, thermal oxidation. In some embodiments, the thickness of the LV gate oxide may be about 10-200 Å. Other techniques for forming the various gate dielectric or oxide layers may also be useful. In other embodiments, the HV gate dielectric layer may not be patterned, but rather the process may proceed directly from HV gate dielectric formation to the formation of the gate electrode layer. In these embodiments, there may be only a single gate dielectric layer used for both LV and HV device regions.

Referring to FIG. 2g, the process continues to form a gate electrode layer 136 on the substrate. The gate electrode layer, for example, may be a silicon layer. The silicon layer, for example, may be a polysilicon layer. The thickness of the gate electrode layer may be about 2000-8000 Å. Other suitable thickness dimensions may also be useful. The gate electrode layer may be formed by, for example, CVD. Other suitable techniques for forming the gate electrode layer may also be useful. In other embodiments, the gate electrode layer may be formed as an amorphous or non-amorphous layer. In the case of an amorphous layer, an anneal may be performed to form a polycrystalline silicon layer. Other configurations of gate electrode layers may also be useful.

In FIG. 2h, the gate electrode and gate dielectric layers are patterned using a gate mask 241 to form a gate 130 and a DFP 140. The gate layers may also be patterned to form gates of other transistors in both the HV and LV device regions. In some embodiments, the same gate layer is used to form the gates of UHV, HV, and LV CMOS transistors. Patterning the layers, for example, may be achieved using an anisotropic etch, such as a RIE. Other techniques for patterning the layers may also be useful. After patterning the gate layers, the gate mask is removed by, for example, ashing.

In one embodiment, as illustrated in FIG. 2i, an implant is performed to form LDD extensions 152 and 153. The LDD extensions, for example, are adjacent to the outer edges of the gate and DFP. The implant to form the LDD extensions may employ a LDD implant mask (not shown). As shown, the LDD implant mask exposes portions of the substrate where LDD extensions are to be formed. For example, the LDD implant mask exposes source and drain regions of the substrate. The implant mask may be a photoresist mask. The implant mask also protects a body well contact region 254 of the substrate. The body well contact region is adjacent to the source region. Providing a STI region between the well contact region and source region may also be useful. The implant implants first polarity type dopants, forming LDD extensions having a depth of about 0.05-0.3 μm. The implant dose may be about $1 \times 10^{13}$-$1 \times 10^{14}/cm^2$ and the implant energy may be about 30-80 KeV. Forming the LDD extensions having other depths using other dose or implant energies may also be useful The LDD implant mask is removed after forming the LDD extensions.

The LDD implant mask may also expose source and drain regions of other first polarity type transistors to form LDD extensions. Additionally, another LDD implant mask may he provided for forming LDD extensions for second polarity type transistors.

In FIG. 2j, sidewall spacers 139 may be formed on the sidewalls of the gates. To form the sidewall spacers, a dielectric layer is deposited on the substrate. The dielectric layer, for example, may be silicon oxide. Other types of dielectric material, such as silicon nitride, or a combination of several layers of different materials, may also be used. The dielectric layer may be formed by CVD. The dielectric layer may also be formed using other techniques. The thickness of the dielectric layer may be, for example, about 50-250 nm. Other thickness for the dielectric layer may also be useful. The thickness, for example, may depend on the desired width of the spacers. An anisotropic etch, such as RIE, may be performed to remove horizontal portions of the dielectric layer, leaving spacers on the sidewalls of the gate. In some applications, the spacer may be formed from multiple dielectric layers.

After forming the spacers, heavily doped source and drain 150 and 151 are formed in the source and drain regions on the substrate. The heavily doped source and drain have first polarity type dopants. Forming the source and drain includes implanting first polarity type dopants into the substrate. The implant may employ a source/drain (S/D) implant mask (not shown). The S/D implant mask may be similar to the one used to form the LDD extensions. For example, the same reticle may be used to expose the photoresist layer. The S/D implant mask may also expose source and drain regions of other first polarity type transistors to form source and drain as well as first polarity type well contact regions to form first polarity type well taps. The depth, for example, may be about 0.1-0.3 μm. Providing source and drain having other depths may also be useful. The implant dose may be about $1 \times 10^{15}$-$1 10^{16}/cm^2$ and the implant energy may be about 1-100 KeV. Other implant parameters may also be useful. In some embodiments, the gate regions are doped at the same time as the source and drain regions. For example, the N+ source and drain implant may be used to dope the gates of NMOS transistors while the P+ source and drain implant may be used to dope the gates of PMOS transistors. After the source and drain are formed, the S/D implant mask is removed.

As described above, the LDDs and source and drain may be formed using different masks. In an alternate embodiment, the LDDs may be formed using the same mask that is used to form the source and drain. In such case, a tilt-angle implant may be performed through the S/D mask opening, causing the implanted LDDs to be implanted laterally under the gate and DIP edges. This reduces the manufacturing cost compared to using dedicated masking step to form the LDDs.

A body well tap or contact 155 is formed in the HV device region, as shown in FIG. 2k. As shown, the body well tap is formed adjacent to the source region 150 and device isolation region 180. In other embodiments, an isolation region (not shown) may be formed in between the source region and body well tap. The body well tap is a heavily doped region having second polarity type dopants. The body well tap, for example, may be formed when forming second polarity type source and drain regions for second polarity type transistors. An implant mask (not shown), such as photoresist, may be used to perform the implant to form the body well tap. The implant mask may also expose source and drain regions of second polarity type transistors to form source and drain. After the implant, the implant mask is removed.

Referring to FIG. 2l, metal silicide contacts 164 are formed on terminals or contact regions of the transistor. For example, the metal silicide contacts are formed on the gate, DFP, source, drain and body well tap of the transistor. The metal silicide contacts, for example, may be cobalt silicide (CoSi). Other types of metal silicide contacts may also be useful. For example, the metal silicide contacts may include titanium, nickel, or other suitable silicide materials. The metal silicide contacts are used to facilitate low resistance contacts between the active substrate and the BEOL metal lines disposed in metal level dielectric layers of the device. In one embodiment, the thickness of the silicide contacts is about 50-500 Å. Providing other thicknesses may also be useful, The process for forming the metal silicide contacts includes depositing a metal layer on the surface of the substrate. The metal layer, for example, may be cobalt or an alloy thereof. Other types of metallic layers, such as titanium, nickel or alloys thereof, may also be used. The metal layer may be formed by physical vapor deposition (PVD). Other processes to form the metal layer may also be useful.

An anneal is performed to initiate a reaction between the metal layer and the silicon regions, forming a silicide layer. For example, the metal layer reacts with the exposed silicon surfaces of the gate electrode, source, drain and body well tap, forming silicide contacts. Metal layer disposed over non-silicon material, such as STI regions and sidewall spacers, are not reacted. In some embodiments, a silicide blocking layer may be used to prevent the formation of silicide on some portions of the substrate that are not protected by STI or sidewall spacers. For example, a dielectric layer may be deposited, masked, and etched, prior to the formation of the silicide. This silicide blocking layer (not shown) may include a deposited oxide layer with a thickness in the range of, for example, about 200-600 Å. Unreacted metal is removed by, for example, a wet removal process. For example, unreacted metal material is removed selective to the silicide contacts. The metal suicide contacts, for example, are formed simultaneously on these regions. Other techniques for forming the silicide contacts may also be useful.

As described, the silicide contacts are self-aligned to the source, drain, gate, DFP and body well tap. This ensures that the complete surfaces of the source, drain, body well tap, gate and DFP are silicided. Front-end-of-line (FEOL) processing, for example, may be completed after silicide formation. The metal silicide contacts may be employed to reduce contact resistance and facilitate contact to the back-end-of-line (BEOL) metal interconnects.

Referring to FIG. 2m, a dielectric layer 190 may be formed over the transistor. The dielectric layer serves as, for example, an inter-level dielectric (ILD) or pre-metal dielectric (PMD) layer, which commences BEOL processing. The dielectric layer, for example, may be silicon oxide. Other types of dielectric materials may also be useful. The dielectric layer may be formed by, for example, CVD. Other deposition techniques, such as high aspect ratio process (HARP) or spin on techniques may also be useful.

In some embodiments, a dielectric etch stop layer (not shown) may be formed over the transistors. The etch stop layer, for example, is a silicon nitride etch stop layer. Other types of etch stop layers may also be useful. The etch stop layer should have a material which can be selectively removed from a dielectric layer thereover. The etch stop layer facilitates in forming contact plugs to contact regions of the transistor. In some embodiments, the etch stop layer may also serve as a stress layer for applying a stress on the channel of the transistor to improve performance.

Via contacts 175, such as tungsten plugs, may be formed in the PMD layer. The via contacts are coupled to the terminals or contact regions of the transistors. For example, the via contacts are coupled to the source and drain regions and gates (not shown) of the transistor. Via contacts are also formed and coupled to the body well tap or well contact. Via contacts are also formed for other transistors in both LV and HV devices regions, and well contacts of other devices in the IC.

To form via contacts, via openings are patterned in the dielectric layer. For example, a via mask, such as photoresist may be used. The via mask is patterned to expose portions of the PMD layer where via openings are formed. An anisotropic etch, such as RIE, is used to form the via openings. The via openings expose contact regions of the transistor. A conductive layer is deposited on the substrate, filling the via openings. For example, a tungsten layer may be formed by sputtering to fill the via openings. A planarizing process, such as an etch back process or CMP, is performed to remove excess conductive material, forming the via contacts.

In FIG. 2n, a conductive layer 192 is formed over the PMD layer. The conductive layer may be aluminum or copper and may include a stack of conductive layers, including barrier metals such as titanium alloys. The conductive layer may be formed by, for example, CVD, sputtering, PVD, or other suitable techniques. In some embodiments, conductive layer 192 may include several layers. For example, barrier layers of titanium and titanium nitride, aluminum, copper, or other suitable materials may be employed. In one embodiment, barrier layers of Ti and TiNi are formed below and above a main conductive layer of aluminum with a thickness in the range of about 4000-8000 Å. Other types of conductive layer or forming techniques may also be useful. The conductive layer, for example, serves as a first metal layer (M1) of the device. The conductive layer may be patterned to form electrodes, such as source electrode 178 and drain electrode 179. The electrodes may be formed using, for example, mask and etch technique. Other techniques for forming the electrodes may also be useful.

In some embodiments, the electrodes may also be formed by damascene technique. This technique includes forming a dielectric layer over the PMD layer 190 and forming trenches in the dielectric layer. The trenches may be formed by, for example, etching the dielectric layer by RIE using an etch mask, such as photoresist. After forming the trenches, the etch mask is removed. The trenches are filled with conductive material, such as aluminum or copper. For example, the trenches are filled with conductive material using plating techniques. Other filling techniques or conductive materials may also be useful. A planarizing process, such as CMP, is performed to remove excess conductive material, forming the source and drain electrodes.

Additional interconnect levels (not shown) may be formed over the first metal level. An additional interconnect level, for example, includes contacts in a via level and interconnects in a metal level of an inter-metal dielectric (MD) layer. After the top interconnect level is formed, a passivation layer (not shown) may be formed. The passivation layer includes suitable dielectric layer such as silicon oxide, silicon nitride, or a combination of dielectric materials. Pad openings are formed in the passivation layer using mask and etch technique. The pad openings provide for external electrical connections via, for example, wire bonding or bumping. Thereafter, dicing, assembly and packaging may be performed. Other processes or alternative processes may also be included to complete the device.

The embodiments may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be e braced therein.

What is claimed is:

1. A device comprising:
   a substrate having a high voltage (HV) device region, wherein the HV device region is defined with first and second device isolation regions and an internal dielectric region, and wherein the device isolation regions and internal dielectric region are shallow trench isolation (STI) regions;
   a HV transistor disposed in the HV device region, wherein the HV transistor comprises
      a gate disposed on the substrate,
      a source region disposed in the substrate adjacent to the gate and first device isolation region,
      a drain region disposed in the substrate adjacent to the second device isolation region;
   a drift well disposed in the substrate, wherein the drift well encompasses the drain region and extends under a portion of the gate;
   a body well disposed in the substrate, wherein the body well encompasses the source region and extends laterally toward the drift well; and
   at least one buried RESURF region disposed within the drift well, wherein the at least one buried RESURF region comprises a first buried RESURF region which is disposed under the internal dielectric region, wherein the first buried RESURF region is an extended buried RESURF region which comprises a planar top surface which is contiguous and in direct contact with a bottom surface of the internal dielectric region, first and second edges that extend laterally beyond edges of the internal dielectric region and a vertical depth of the extended buried RESURF region is substantially constant for portions of the buried RESURF region that are under the internal dielectric region and portions of the buried RESURF region that extend beyond and are outside of the internal dielectric region, and the extended buried RESURF region effectively reduces electric fields that are caused by material discontinuities at the edges of the internal dielectric region.

2. The device of claim 1 wherein:
the substrate, the body well and the at least one buried RESURF region comprise second polarity type dopants; and
the source and drain regions and the drift well comprise first polarity type dopants.

3. The device of claim 1 wherein the STI regions have a top surface which is substantially planar with a top surface of the substrate.

4. The device of claim 1 wherein the drain region is displaced away from the internal dielectric region.

5. The device of claim 1 wherein the internal dielectric region comprises a width which is wider than a width of the first and second device isolation regions along a channel length direction of the HV device region.

6. The device of claim 5 wherein:
the first device isolation region surrounds the HV transistor;
the internal dielectric region comprises a racetrack shape; and
the second device isolation region is enclosed by the internal dielectric region.

7. The device of claim 5 wherein
the internal dielectric region comprises a finger-type layout having one or more fingers;
the first device isolation region surrounds the HV transistor and extends into the fingers of the internal dielectric region in an interdigitated manner; and
the second device isolation region is enclosed by the internal dielectric region.

8. The device of claim 1 wherein:
the HV transistor further comprises a drain field plate (DFP) disposed on the substrate, wherein the gate and the DFP each comprises a gate electrode and a gate dielectric, and wherein a first portion of the gate electrode of the gate and DFP is in direct contact with a portion of the internal dielectric region while a second portion of the gate electrode of the gate and DFP is disposed over and in direct contact with the gate dielectric.

9. The device of claim 8 wherein the gate dielectric of the DFP is disposed over and in direct contact with a portion of the drift well which separates the drain region from the internal dielectric region.

10. The device of claim 1 wherein the at least one buried RESURF region comprises a second buried RESURF region which is disposed below the first buried RESURF region and vertically separated from the first buried RESURF region by a portion of the drift well.

11. The device of claim 10 wherein the second buried RESURF region has a greater lateral separation from the source region compared to a lateral separation of the first buried RESURF region from the source region.

12. The device of claim 10 wherein lateral edges of the first and second buried RESURF regions are aligned.

13. The device of claim 1 further comprising a body well contact disposed within the body well, wherein the body well contact comprises second polarity type dopants.

14. The device of claim 1 wherein the drift well extends laterally from the second device isolation region to underlap a portion of the gate, and wherein the drift well also encompasses the internal dielectric region.

15. A high voltage (HV) transistor comprising:
a semiconductor substrate having a first conductivity type;
an internal dielectric region disposed in the substrate, the internal dielectric region having a top surface which is substantially planar with a top surface of the substrate;
a gate disposed on the substrate;
a source region disposed in the substrate adjacent to the gate;
a drain region disposed in the substrate, wherein the drain region is separated from the source region by the internal dielectric region;
a drift well disposed in the substrate, wherein the drift well encompasses the drain region, extends under a first portion of the gate, and is separated from the source region by a second portion of the gate;
a body well disposed in the substrate, wherein the body well encompasses the source region and extends laterally under the gate toward the drift well; and
a first buried RESURF region disposed within the drift well and under the internal dielectric region, wherein the first buried RESURF region is an extended buried RESURF region which comprises
a planar top surface which is contiguous and in direct contact with a bottom surface of the internal dielectric region,
first and second edges that extend laterally beyond edges of the internal dielectric region and a vertical depth of the buried RESURF region is substantially constant for portions of the buried RESURF region that are under the internal dielectric region and portions of the buried RESURF region that extend beyond and are outside of the internal dielectric region, and the extended buried RESURF region effectively reduces electric fields that are caused by material discontinuities at the edges of the internal dielectric region.

16. The device of claim 15 wherein the internal dielectric region is a shallow trench isolation (STI) region comprising a deposited oxide layer and having a depth in the range of about 200 to 600 nm.

17. The device of claim 15 wherein the drain region is displaced away from the internal dielectric region.

18. The device of claim 15 further comprising a second buried RESURF region which is disposed below the first buried RESURF region and vertically separated from the first buried RESURF region by a portion of the drift well.

19. The device of claim 18 wherein the second buried RESURF region has a greater lateral separation from the source region compared to a lateral separation of the first buried RESURF region from the source region.

20. The device of claim 18 wherein lateral edges of the first and second buried RESURF regions are aligned.

21. The device of claim 15 wherein the HV transistor further comprises a drain field plate (DFP) disposed on the substrate, wherein the gate and the DFP each comprises a gate electrode and a gate dielectric, wherein a first portion of the gate electrode of the gate and DFP is in direct contact with a portion of the internal dielectric region while a second portion of the gate electrode of the gate and DFP is disposed over and in direct contact with the gate dielectric.

22. The device of claim 21 wherein the gate dielectric of the DFP is disposed over and in direct contact with a portion of the drift well which separates the drain region from the internal dielectric region.

23. The device of claim 21 wherein the drain region is disposed adjacent to the DFP and underlaps a portion of the DFP.

24. A device comprising:
- a substrate;
- a high voltage (HV) device region disposed in the substrate, wherein the HV device region is defined with first and second device isolation regions and an internal dielectric region, wherein
  - the device isolation regions and the internal dielectric region are shallow trench isolation (STI) regions,
  - the internal dielectric region has a top surface which is substantially planar with a top surface of the substrate;
- a HV transistor disposed in the HV device region, wherein the HV transistor comprises
  - a gate and a drain field plate (DFP) disposed on the substrate, the gate and the DFP further comprises
    - a gate electrode and a gate dielectric, wherein a first portion of the gate electrode of the gate and DFP is in
    - direct contact with a portion of the internal dielectric region, a second portion of the gate electrode of the gate and DFP is
    - disposed over and in direct contact with the gate dielectric,
  - a source region disposed in the substrate adjacent to the gate and first device isolation region,
  - a drain region disposed in the substrate adjacent to the DFP and the second device isolation region, wherein the drain region is separated from the source region by the internal dielectric region,
  - a light doped drain (LDD) extension disposed at the source and drain regions and extends under the gate and DFP,
  - a dielectric sidewall spacer disposed on sidewalls of the gate and DFP;
- a drift well disposed in the substrate, wherein the drift well encompasses the drain region and extends under a portion of the gate, and is separated from the source region by a second portion of the gate;
- a body well disposed in the substrate, wherein the body well encompasses the source region, extends laterally toward the drift well and comprises
  - a body well contact disposed adjacent to the source that facilitates contacting and biasing the body well; and
- at least one buried RESURF region disposed within the drift well, wherein the at least one buried RESURF region comprises a first buried RESURF region which is disposed under the internal dielectric region, wherein the first buried RESURF region is an extended buried RESURF region which comprises
  - a planar top surface which is contiguous and in direct contact with a bottom surface of the internal dielectric region,
  - first and second edges that extend laterally beyond edges of the internal dielectric region and a vertical depth of the extended buried RESURF region is substantially constant for portions of the buried RESURF region that are under the internal dielectric region and portions of the buried RESURF region that extend beyond and are outside of the internal dielectric region, and the extended buried RESURF region effectively reduces electric fields that are caused by material discontinuities at the edges of the internal dielectric region.

25. The device of claim 24 wherein the gate dielectric of the DFP is disposed over and in direct contact with a portion of the drift well which separates the drain region from the internal dielectric region.

26. The device of claim 24 wherein the at least one buried RESURF region comprises a second buried RESURF region which is disposed below the first buried RESURF region and vertically separated from the first buried RESURF region by a portion of the drift well.

27. The device of claim 26 wherein the second buried RESURF region has a greater lateral separation from the source region compared to a lateral separation of the first buried RESURF region from the source region.

28. The device of claim 26 wherein lateral edges of the first and second buried RESURF regions are aligned.

29. The device of claim 24 wherein metal silicide contacts are disposed on the contact regions of the transistor which includes the exposed source, drain, body well tap, DFP, and gate electrode regions.

* * * * *